(12) United States Patent
Hsieh

(10) Patent No.: US 8,058,685 B2
(45) Date of Patent: Nov. 15, 2011

(54) TRENCH MOSFET STRUCTURES USING THREE MASKS PROCESS

(75) Inventor: Fu-Yuan Hsieh, Banciao (TW)

(73) Assignee: Force Mos Technology Co., Ltd. (TW)

( * ) Notice: Subject to any disclaimer, the term of this patent is extended or adjusted under 35 U.S.C. 154(b) by 0 days.

(21) Appl. No.: 12/654,327

(22) Filed: Dec. 17, 2009

(65) Prior Publication Data

US 2011/0006363 A1    Jan. 13, 2011

Related U.S. Application Data

(63) Continuation-in-part of application No. 12/458,293, filed on Jul. 8, 2009, now Pat. No. 7,816,720.

(51) Int. Cl.
*H01L 29/772* (2006.01)

(52) U.S. Cl. . 257/330; 257/332; 257/302; 257/E27.091; 257/E29.198; 257/E29.201; 257/E29.26; 257/E21.548; 257/E29.257; 257/E21.55; 257/E21.551; 257/E21.553; 257/E21.655

(58) Field of Classification Search .................. None
See application file for complete search history.

(56) References Cited

U.S. PATENT DOCUMENTS

| | | | | |
|---|---|---|---|---|
| 7,816,720 B1 * | 10/2010 | Hsieh | | 257/302 |
| 2001/0041407 A1 * | 11/2001 | Brown | | 438/270 |

* cited by examiner

*Primary Examiner* — Minh-Loan T Tran
*Assistant Examiner* — Fei Fei Yeung Lopez
(74) *Attorney, Agent, or Firm* — Bacon & Thomas, PLLC

(57) ABSTRACT

A trench MOSFET structure having improved avalanche capability is disclosed, wherein the source region is formed by performing source Ion Implantation through contact open region of a contact interlayer, and further diffused to optimize a trade-off between Rds and the avalanche capability. Thus, only three masks are needed in fabrication process, which are trench mask, contact mask and metal mask. Furthermore, said source region has a doping concentration along channel region lower than along contact trench region, and source junction depth along channel region shallower than along contact trench, and source doping profile along surface of epitaxial layer has Guassian-distribution from trenched source-body contact to channel region.

19 Claims, 32 Drawing Sheets

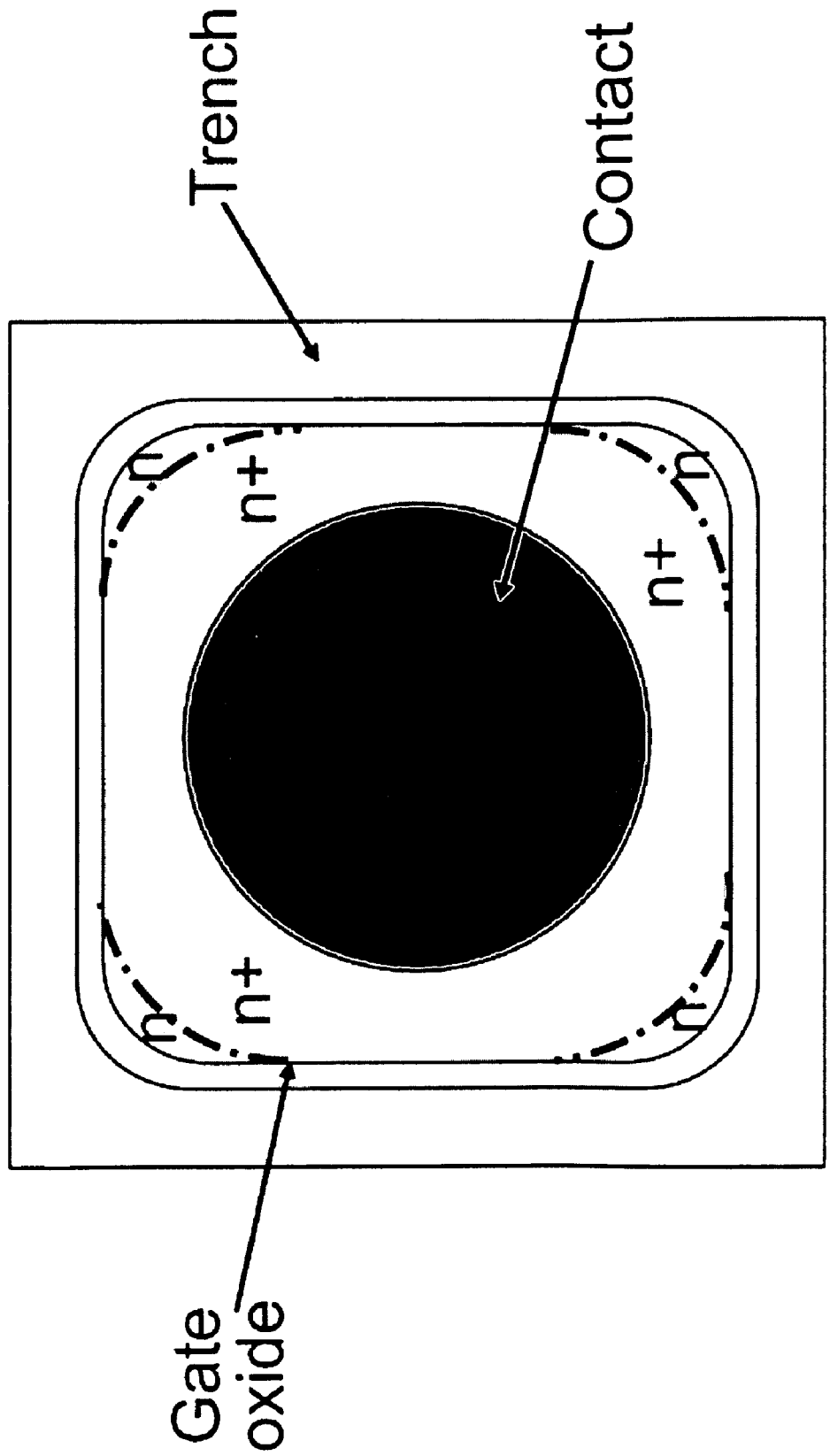

TRENCH MOSFET STRUCTURES USING THREE MASKS PROCESS

CROSS-REFERENCE TO RELATED APPLICATION

This application is a Continuation-In-Part of U.S. patent application Ser. No. 12/458,293 of the same inventor, filed on Jul. 8, 2009 entitled "Trench MOSFET structure having improved avalanche capability using three mask process, now U.S. Pat. No. 7,816,720", which is incorporated herewith by reference.

FIELD OF THE INVENTION

This invention relates generally to the cell structure and device configuration of semiconductor devices. More particularly, this invention relates to an improved trenched MOSFET configuration having improved avalanche capability by three masks process.

BACKGROUND OF THE INVENTION

Please refer to FIG. 1A for a conventional N-channel trench MOSFET structure of prior art (U.S. Pat. No. 6,888, 196) with n+ source regions having same surface doping concentration and junction depth along trenched source-body contact and channel region. The disclosed N-channel trench MOSFET cell is formed in an N epitaxial layer 102 supported on an N+ substrate 100. Near the top surface of a P body region 103, which is formed within said epitaxial layer 102, n+ source region 104 is implanted around the top portion of trenched gates 105 and adjacent to the sidewalls of trenched source-body contact 106. As mentioned above, said n+ source region 104 has a same surface doping concentration and a same junction depth (Ds, as illustrated in FIG. 1A) along epitaxial surface, which is related to the formation process of said n+ source region 104.

FIG. 1B shows the fabrication method of said n+ source regions 104. After the formation of the P body region 103 and its diffusion, said n+ source region 104 is formed by performing source dopant Ion Implantation through a source mask (not shown). The top surface of said P body region 103 suffered the same source dopant Ion Implantation and the same n+ dopant diffusion step, therefore said n+ source region has same doping concentration and same junction depth along the epitaxial surface.

This uniform distribution of doping concentration and junction depth of said n+ source region may lead to a hazardous failure during UIS (Unclamped Inductance Switching) test, please refer to FIG. 1C for a top view of said n+ source region 104 and said trenched source-body contact 106 shown in FIG. 1A. As illustrated, $R_{be}$ is the base resistance from said trenched source-body contact 106 to the cell corner; $R_{be}$ is the base resistance from said trenched source-body contact 106 to the cell edge. Obviously, $R_{be}$ is greater than $R_{be}$ because the distance from said trenched source-body contact 106 to the cell corner is longer than that from said trenched source-body contact 106 to the cell edge, resulting in UIS failure occurring at the trench corner and a poor avalanche capability for closed cell at cell corners as the parasitic NPN bipolar transistor is easily turned on.

Accordingly, it would be desirable to provide a new and improved device configuration to avoid the UIS failure occurred at the trench corner in a trench MOSFET while having a better avalanche capability.

SUMMARY OF THE INVENTION

The present invention has been conceived to solve the above-described problems with the related art, and it is an object of the invention to provide a technique which makes it possible to reduce the area occupied by cells to be formed on a substrate, thereby following a reduction of the size of devices.

In order to solve the above-described problems, according to a first aspect of the invention, there is provided a trench semiconductor power MOSFET comprising a plurality of transistor cells with each cell composed of a plurality of first trenched gates with each surrounded by a source region heavily doped with a first conductivity type in active area encompassed in a body region of a second conductivity type above a drain region disposed on a bottom surface of a low-resistivity substrate of said first conductivity, wherein: said plurality of transistor cells formed in an epitaxial layer with said first conductivity type over said low-resistivity substrate, and with a lower doping concentration than said low-resistivity substrate; said source region has doping concentration along channel region lower than along trenched source-body contact region at same distance from the surface of said epitaxial layer, and source junction depth is shallower along said channel region than along said trenched source-body contact, and the doping profile of said source region along the surface of said epitaxial layer has Gaussian-distribution from said trenched source-body contact to said channel region, as shown in FIG. 2A; said plurality of first trenched gates filled with doped poly padded with a first insulation layer as gate oxide. Each said transistor cell further comprising: at least a second trenched gate having wider trench width than said first trenched gates and filled with doped poly padded with a first insulation layer as gate oxide; a second insulation layer functioning as contact interlayer; a plurality of trenched source-body contacts penetrating through said second insulation layer and said source regions, and extending into said body regions to contact both said source regions and said body regions; at least a trenched gate contact penetrating through said second insulation layer and extending into said doped poly in said second trenched gate; a body contact area heavily doped with said second conductivity type around the bottom of each said trenched source-body contact; a source metal connected to said source regions and said body regions; a gate metal connected to said second trenched gate.

According to an added feature of the present invention, in some preferred embodiments, the dopant of said source region is diffused to just reach cell edge, please refer to FIG. 2B for a top view of an N-channel trench MOSFET structure, the dash-dotted line illustrates the area of said n+ source region with a doping concentration no less than $1 \times 10^{19}$ cm$^{-3}$. At cell corners, the n region has a lower doping concentration due to the Gaussian-distribution, which is less than $1 \times 10^{19}$ cm$^{-3}$. Therefore, a Source Ballast Resistance (SBR) of said n region exists at cell corners, which reduces the Emitter injection efficiency of the parasitic NPN bipolar transistor, thus rendering it difficult to turn on, avoiding the UIS failure issue and improving the avalanche capability. In other preferred embodiments, the dopant of said source region is diffused further after reaching the cell edge to optimize trade-off between $R_{ds}$ (resistance between drain and source) and avalanche capability, please refer to FIG. 2C for another top view of an N-channel trench MOSFET structure. At the cell edge, said n+ source region is adjacent to the gate oxide, therefore the area of lower doped n region at the cell edge is smaller than that in FIG. 2B. It seems that the source resistance is reduced at cell corner, breaching the desire of enhancing the avalanche capability, however, as the $R_{ds}$ is the same important, and it is reduced by shortening the distance of highly doped region to the cell edge, therefore, a trade-off is achieved between the avalanche capability and the $R_{ds}$, optimizing the device to a better performance.

According to an added feature of the present invention, in some preferred embodiments, as shown in FIG. 3A and FIG. 6, each of said plurality of trenched source-body contacts has vertical sidewalls in said source regions and said body regions; in other preferred embodiments, as shown in FIG. 4 and FIG. 7, each of said plurality of trenched source-body contacts has slope sidewalls in said source regions and said body regions; in other preferred embodiments, as shown in FIG. 5 and FIG. 8, each of said plurality of trenched source-body contacts has vertical sidewalls in said source regions and has slope sidewalls in said body regions to enlarge heavily-doped body contact region wrapping said slope trench sidewalls and the bottom to further improve device avalanche capability.

According to an added feature of the present invention, in some preferred embodiments, as shown in FIG. 3A, FIG. 4 and FIG. 5, said plurality of trenched source-body contacts and said trenched gate contact are filled with W (Tungsten) plugs padded by a barrier layer Ti/TiN or Co/TiN or Ta/TiN connecting with said source metal and said gate metal, respectively; in other preferred embodiments, as shown in FIG. 6, FIG. 7 and FIG. 8, said plurality of trenched source-body contacts and said trenched gate contact are filled with said source metal and said gate metal, respectively, to enhance the metal contact performance.

According to an added feature of the present invention, in some preferred embodiments, the configuration of each of said transistor cells is square or rectangular closed cell, please refer to FIG. 9A, FIG. 10A, FIG. 11A and FIG. 14A for the top view of each of preferred closed cell; in other preferred embodiments, the configuration of each of said transistor cells is stripe cell, please refer to FIG. 12, FIG. 13 and FIG. 15 for the top view of each of preferred stripe cell.

According to an added feature of the present invention, in some preferred embodiments, as shown in FIG. 9B, FIG. 10B, FIG. 10C, FIG. 14B and FIG. 14C, the termination area of each of said transistor cells has multiple trenched floating gates composed of a plurality of third trenched gates filled with said doped poly padded with said gate oxide surrounded by said body regions, and no said source regions between two adjacent said third trenched gates in said termination area.

According to an added feature of the present invention, in some preferred embodiments, as shown in FIG. 10B, each of said transistor cells further comprising at least a fourth trenched gate between said first trenched gate and said second trenched gate to block source dopant lateral diffusion at edge corner for improving avalanche capability, said fourth trenched gate is shorted with said source region and filled with said doped poly padded with a gate oxide.

According to an added feature of the present invention, in some preferred embodiments, said plurality of trenched source-body contacts in said active area has a uniform trenched contact width, please refer to FIG. 12 for a top view of a preferred transistor cell; in other preferred embodiment, among said plurality of trenched source-body contacts, at least one column or raw cells near contact edge have greater trenched contact width than the others, please refer to FIG. 13 and FIG. 14 for preferred transistor cells.

According to an added feature of the present invention, in some preferred embodiments, as shown in FIG. 9B and FIG. 10B, the body region between said second trenched gate and the adjacent first trenched gate is shorted with said source region via edge contact; in other preferred embodiment, as shown in FIG. 14B, the body region between said second trenched gate and the adjacent first trenched gate has floating voltage as there is no edge contact.

The present invention further provides a method for manufacturing a trench semiconductor power MOSFET comprising method to form source regions with Gaussian-distribution by performing source Ion Implantation through open region of a contact interlayer covering said epitaxial layer, which means said source region is implanted after the formation of said contact interlayer, as shown in FIG. 2A. Using this method, the doping concentration of said source region along the epitaxial surface is Gaussian-distributed from the contact window to channel region, and the junction depth of said source region is shallower in channel region than that in contact open region, resulting in a lower base resistance than prior art. In an alternative, said contact interlayer includes a layer of un-doped SRO and a layer of BPSG whereon, when forming the trenched source-body contact, the contact width within said BPSG or PSG layer is wider than that in un-doped SRO layer because during etching process, the BPSG or PSG has about 5~10 times etching rate of un-doped SRO if dilute HF chemical is used, resulting in a reduction of contact resistance between the contact filling-in metal plug and said source metal.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein:

FIG. 2C is a top view for showing another source region diffusion method according to the present invention.

DETAILED DESCRIPTION OF THE EMBODIMENTS

Figure 1A:
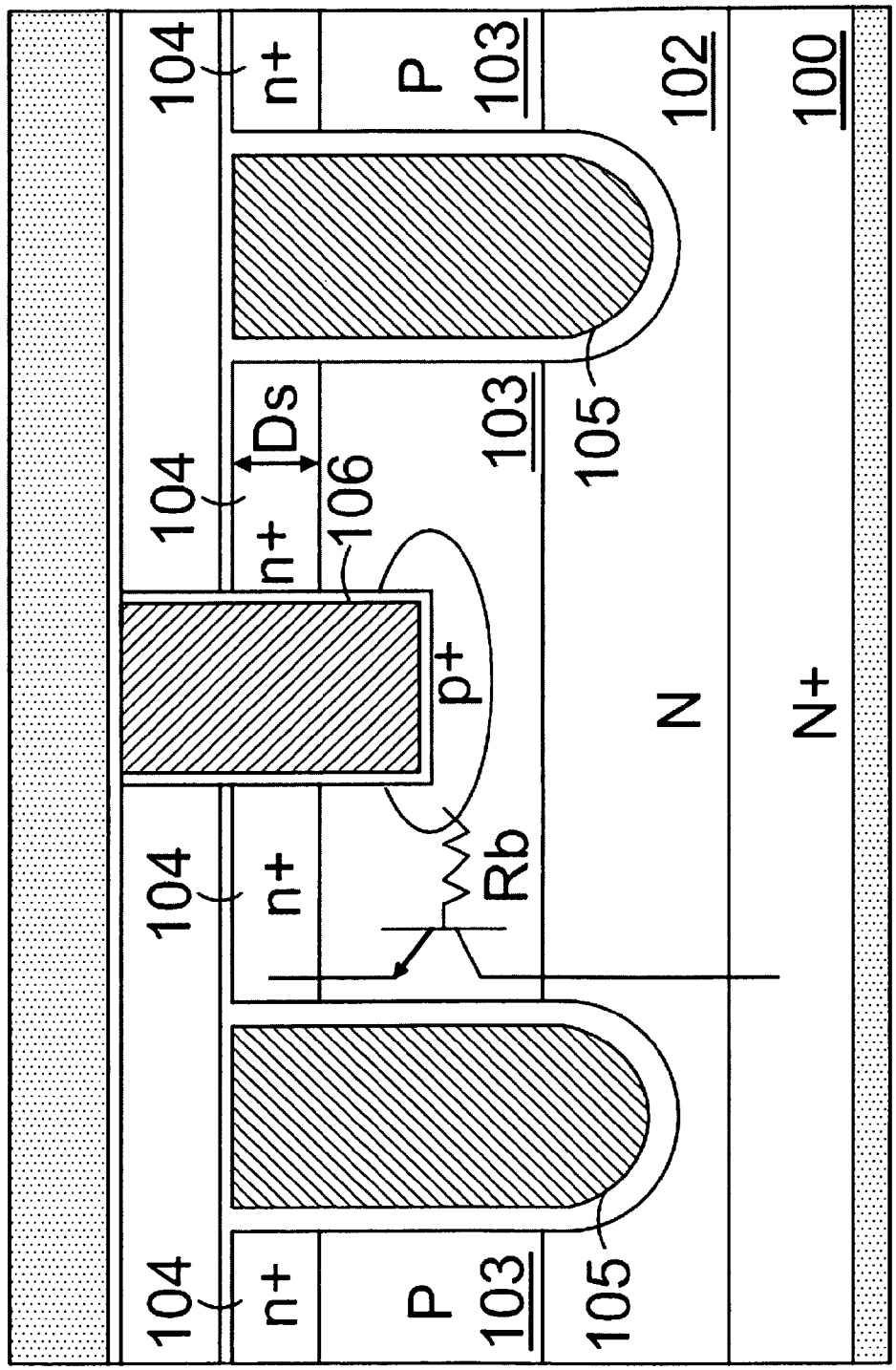
FIG. 1A is a side cross-sectional view of a trench MOSFET of prior art.
Figure 1B:
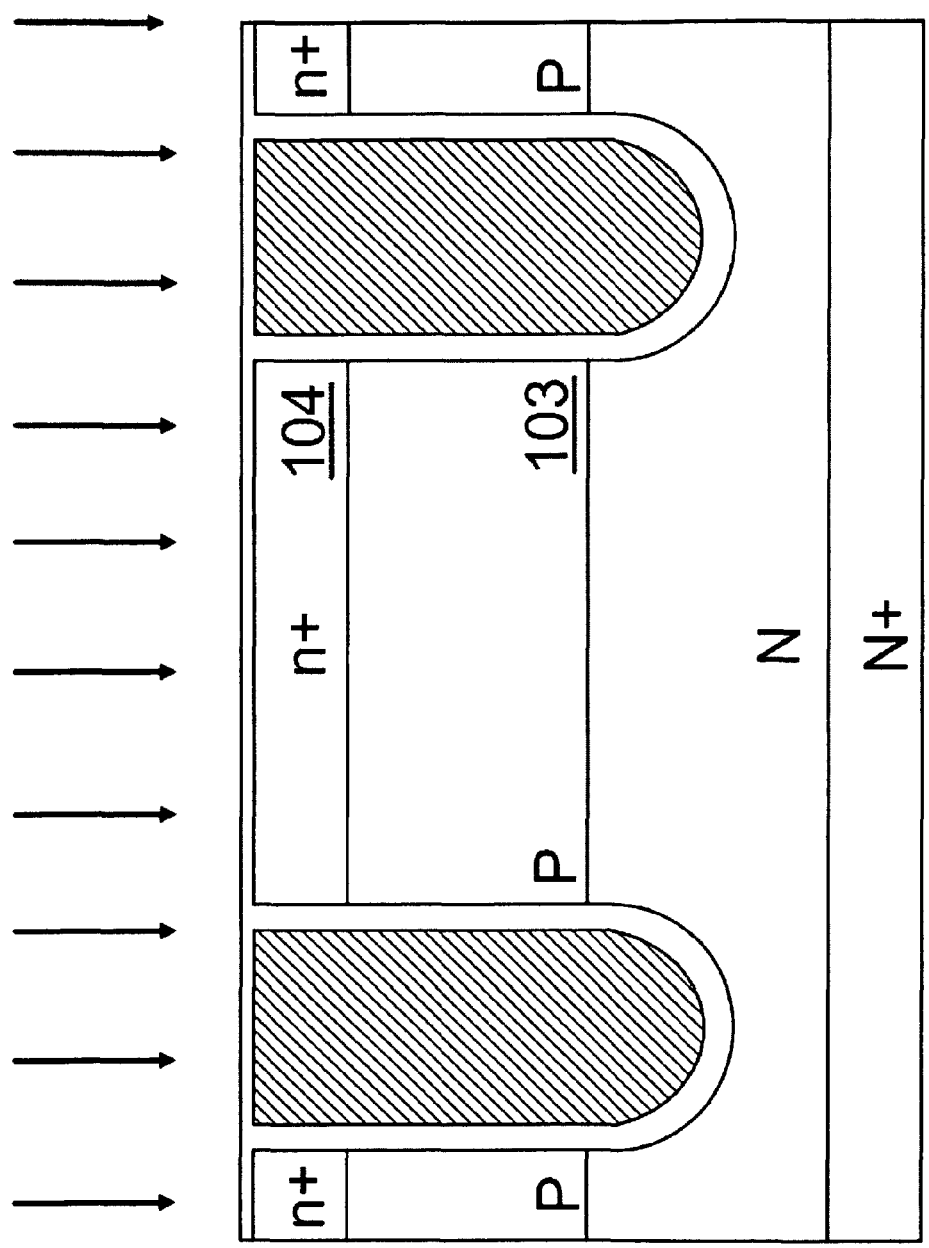
FIG. 1B is a side cross-sectional view of prior art for showing the formation method of source region in prior art.
Figure 1C:
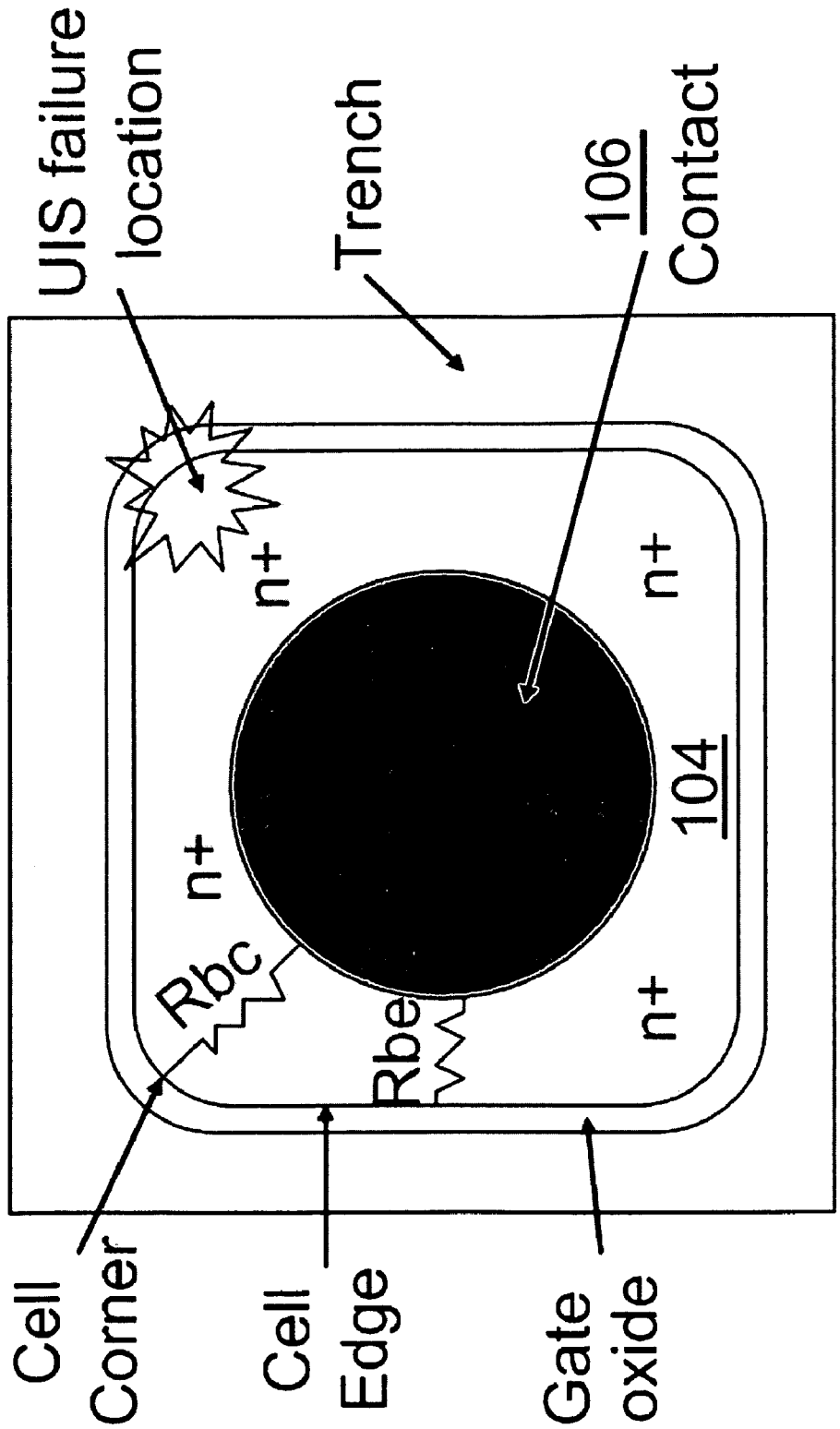
FIG. 1C is a top view of prior art for showing the disadvantage of prior art.
Figure 2A:
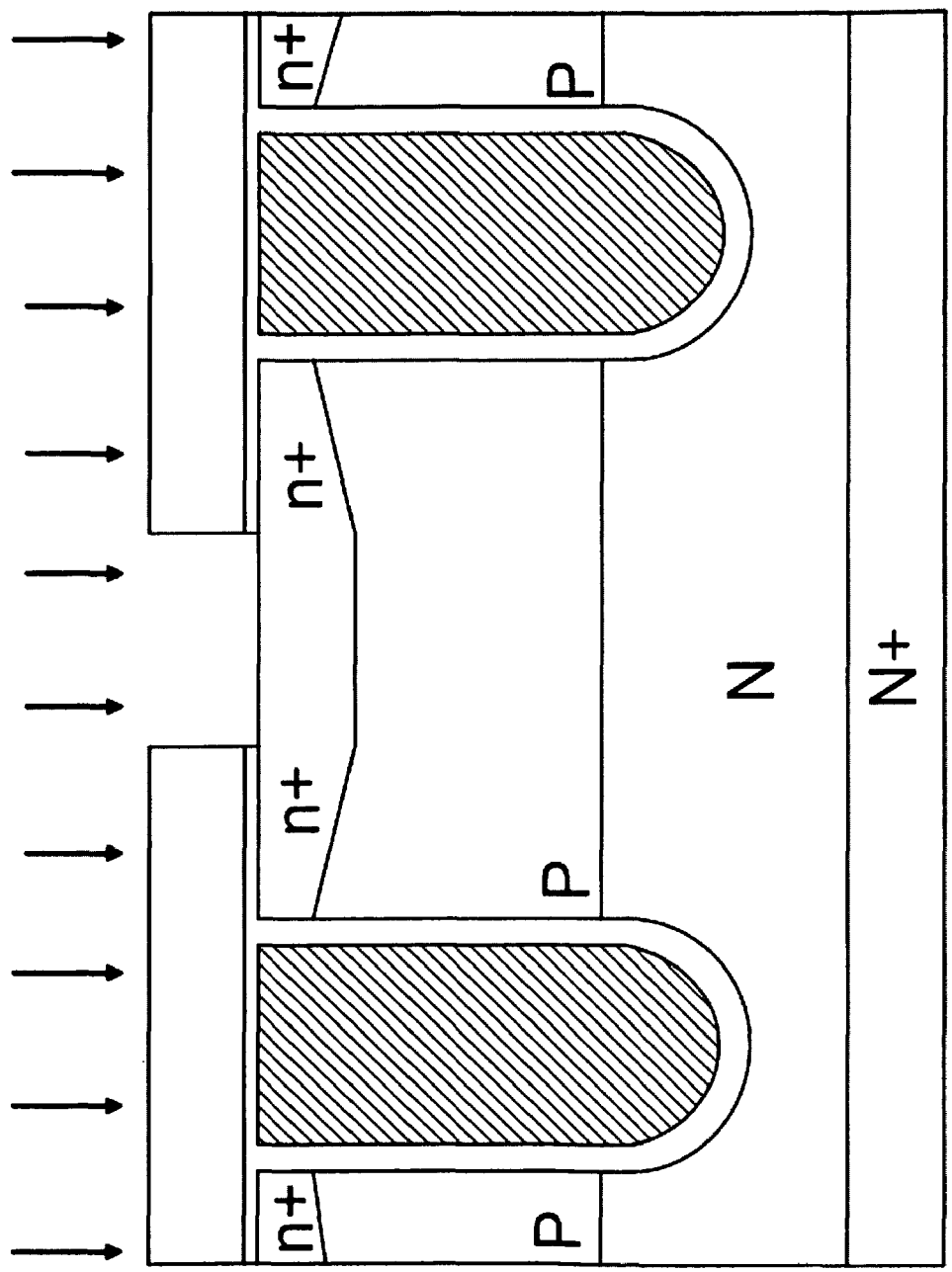
FIG. 2A is a side cross-sectional view for showing the formation method of source region according to the present invention.
Figure 2B:
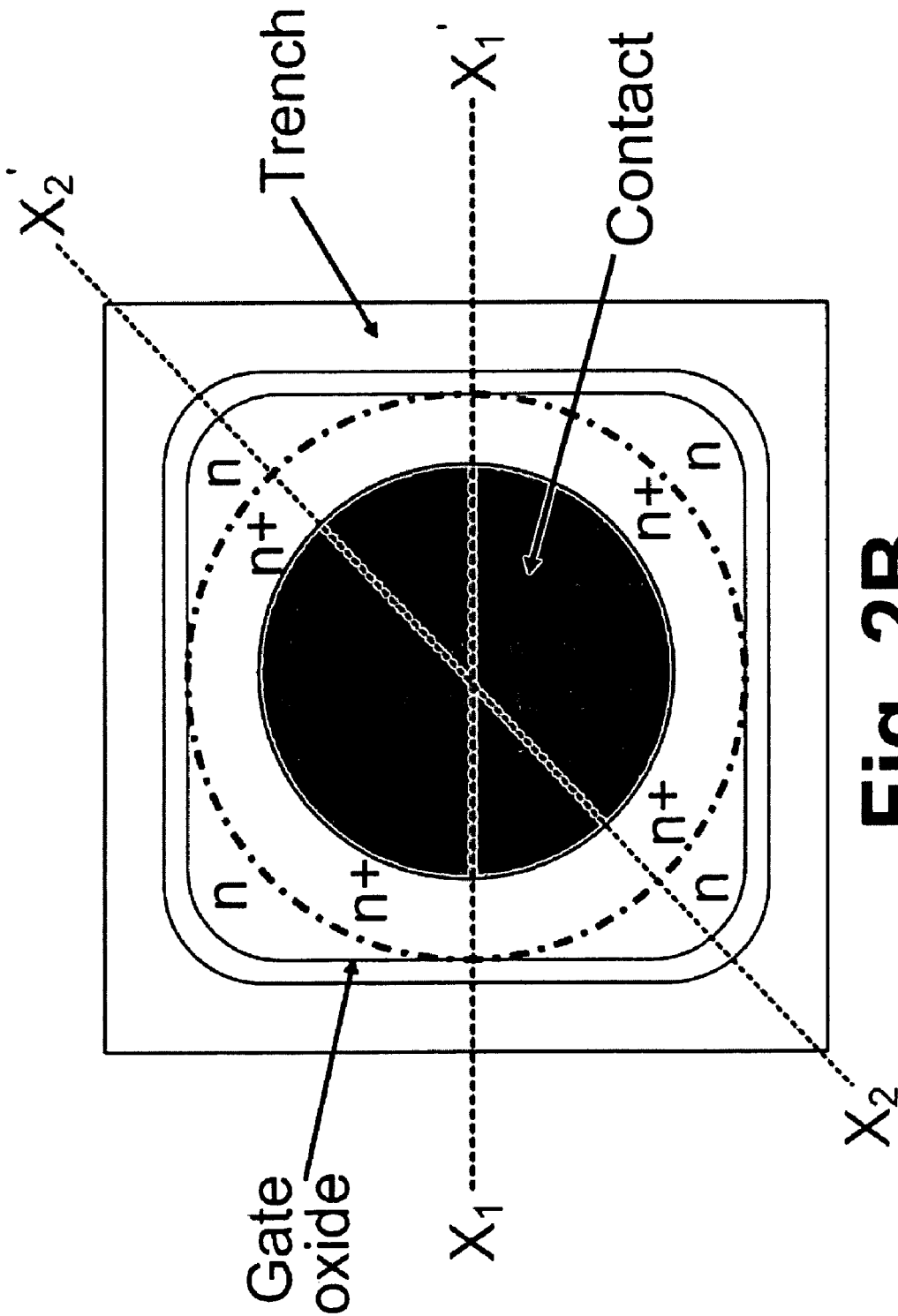
FIG. 2B is a top view for showing a source region diffusion method according to the present invention.
Figure 3A:
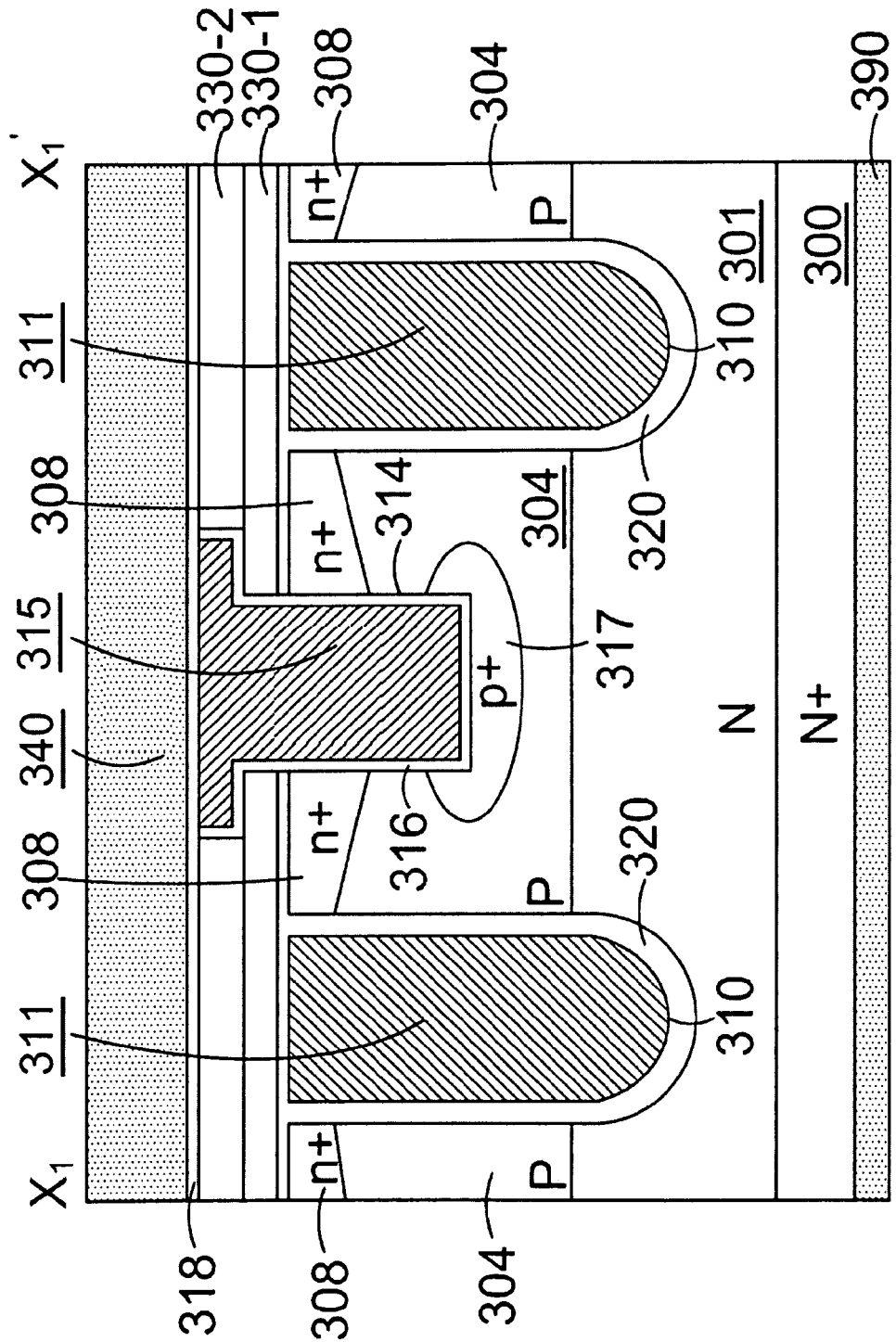
FIG. 3A is a side cross-sectional view of an N-channel trench MOSFET showing a preferred embodiment according to the present invention, which is also the $X_1$-$X_1$' cross section in FIG. 2B.

Please refer to FIG. 3A for a preferred embodiment of this invention, which also is the $X_1$-$X_1$' cross section of FIG. 2B, where an N-channel trench MOSFET is formed on an N+ substrate 300 coated with back metal 390 of Ti/Ni/Ag on rear side as drain electrode. Onto said N+ substrate 300, a lighter doped N epitaxial layer 301 is grown, and a plurality of first trenched gates 310 filled with doped poly 311 onto a gate oxide 320 are formed wherein. Near the top surface of P body regions 304, n+ source regions 308 are formed with Gaussian-distribution from the open region of trenched source-body contact 314 to channel region near said first trenched gate 310. Each of said trenched source-body contacts 314 filled with W (tungsten) plug 315 padded by a barrier layer 316 of Ti/TiN or Co/TiN or Ta/TiN are penetrating through a contact interlayer comprising a layer of un-doped SRO (Silicon Rich Oxide) 330-1 and a layer of BPSG (Boron Phosphorus Silicon Glass) or PSG (Phosphorus Silicon Glass) 330-2, and through said n+ source region 308 and extending into said P body region 304 with vertical sidewalls. Especially, said trenched source-body contact 314 has a wider trench contact width in said BPSG or PSG layer 330-2 than in other potion. Underneath the bottom of said trenched source-body contact 314, a p+ body contact area 317 is implanted to further reduce the contact resistance between said W plug 315 and said P body region 304. Onto a resistance-reduction layer 318 of Ti or Ti/TiN, source metal 340 composed of Al alloys or Cu alloys is deposited to electrically contact with said W plug 315.

Figure 3B:
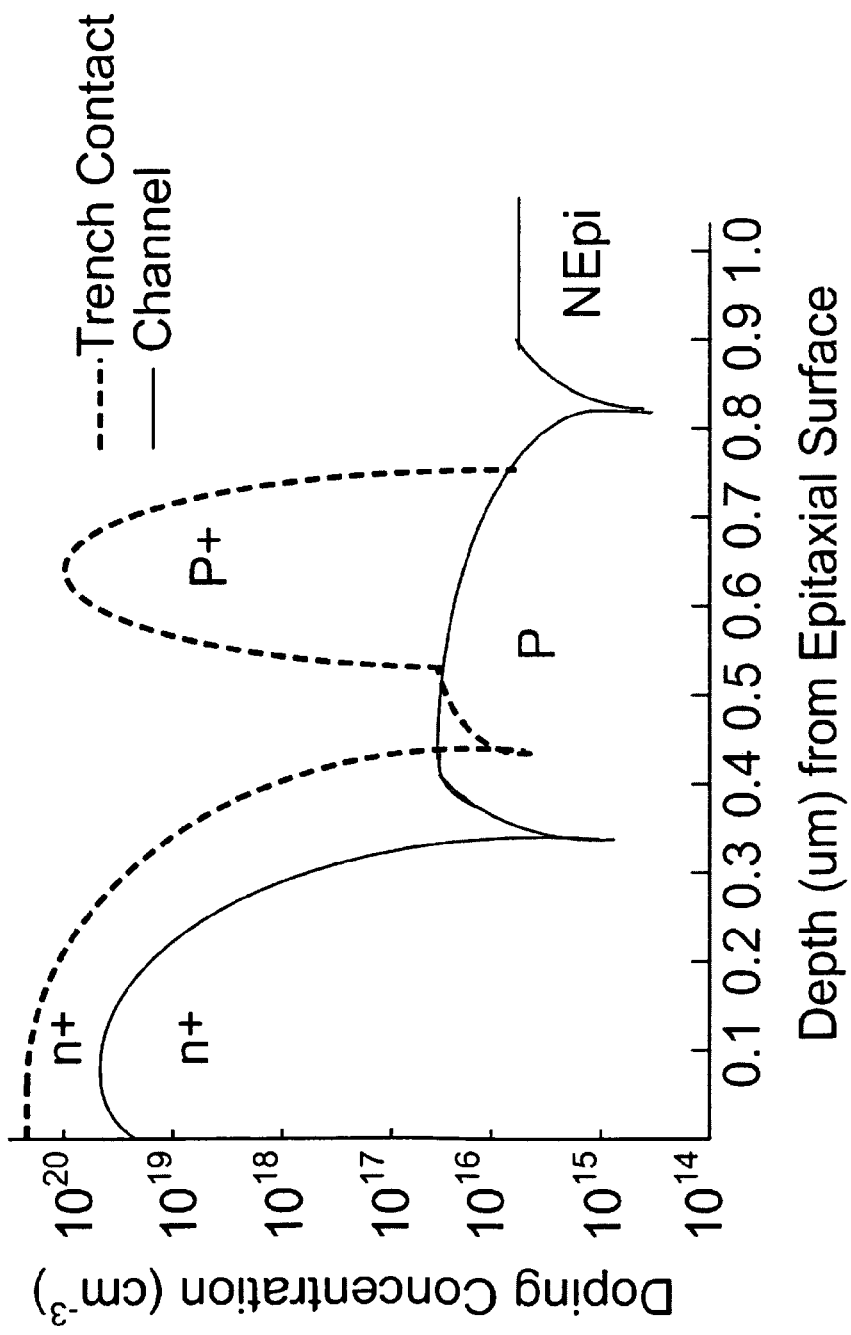
FIG. 3B is the doping profiles for showing the relationship between depth from epitaxial surface and doping concentration in trenched source-body contact and channel region, respectively.
Figure 3C:
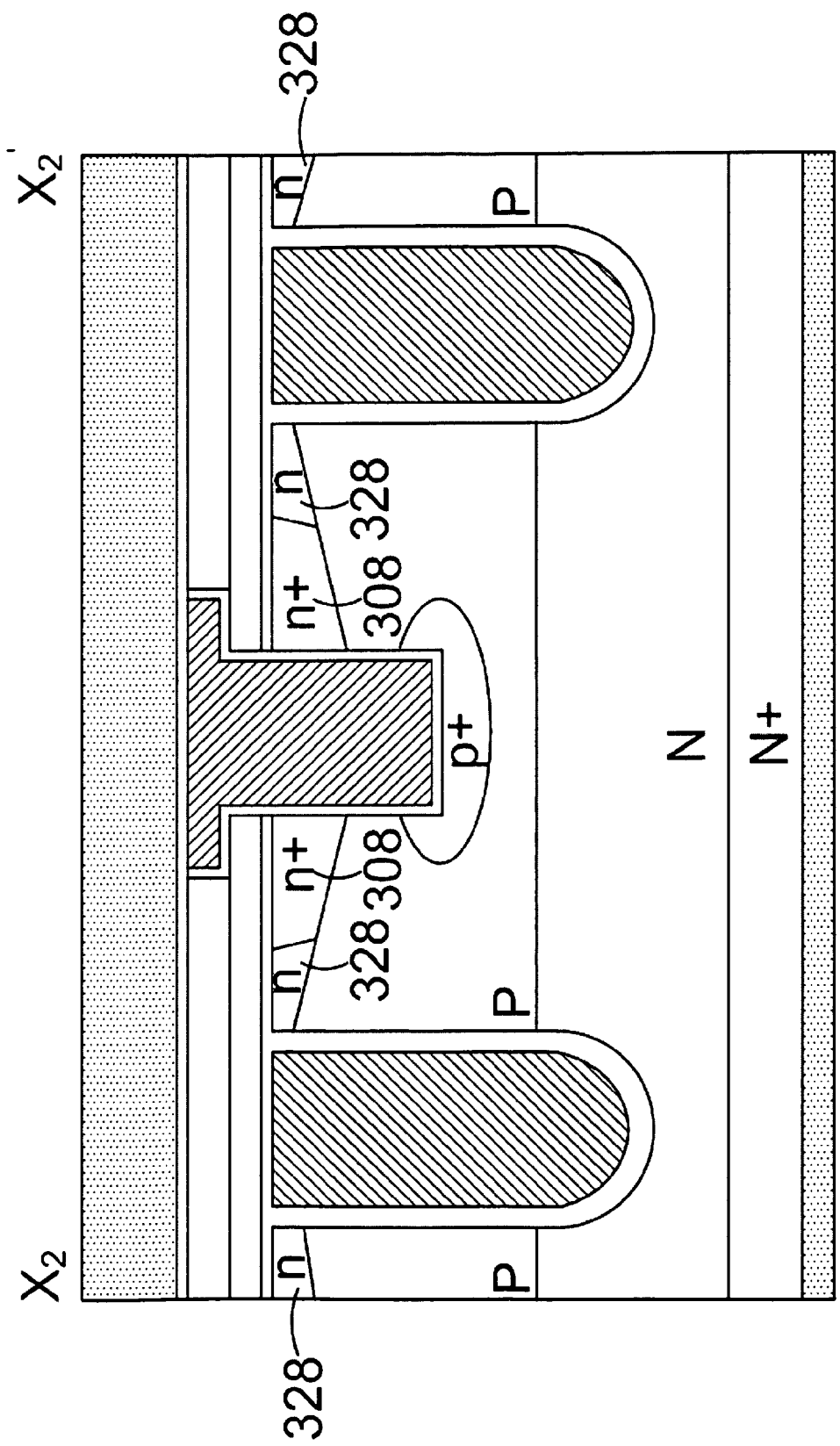
FIG. 3C is another side cross-sectional view of the preferred embodiment shown in FIG. 3A for showing the $X_2$-$X_2$' cross section in FIG. 2B.

In order to further make clear, FIG. 3B illustrates the doping profiles along said trenched source-body contact 314 and the channel region from the surface of said N epitaxial layer 301 in said N-channel trench MOSFET shown in FIG. 3A. In FIG. 3B, n+ represents said n+ source region 308, P represents said P body region 304, and p+ represents said p+ body contact area 317. FIG. 3C shows the $X_2$-$X_2$' cross section of FIG. 2B, in cell corners, n region 328 has a lower doping concentration and shallower junction depth than said n+ source region 308, resulting in a lower base resistance to further enhance avalanche capability.

Figure 4:
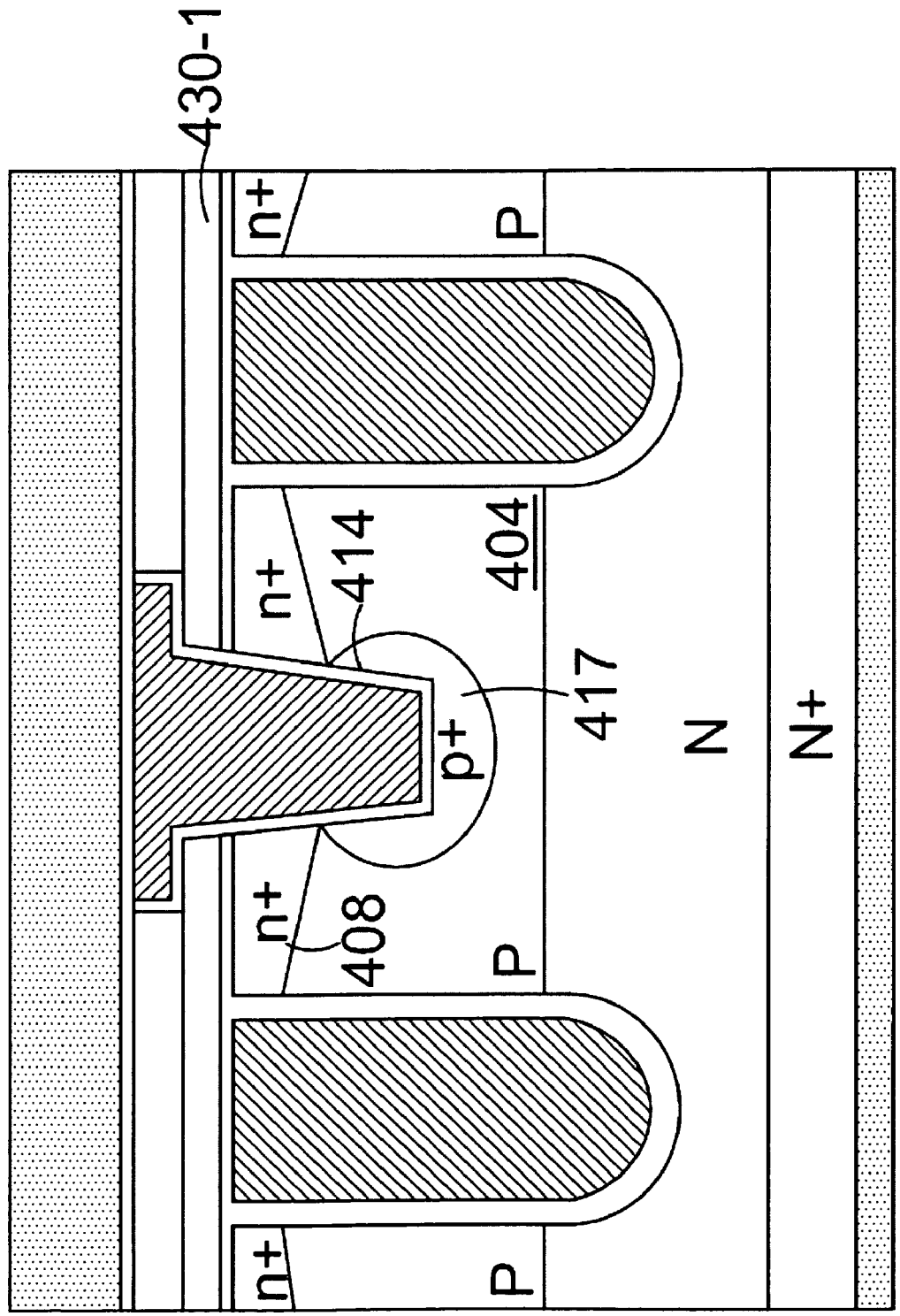
FIG. 4 is the side cross-sectional view of an N-channel trench MOSFET showing another preferred embodiment according to the present invention.

Please refer to FIG. 4 for another preferred embodiment of the present invention where the N-channel trench MOSFET is similar to that in FIG. 3A except that, each of the trenched source-body contact 414 has slope sidewalls in P body region 404, in n+ source region 408 and in un-doped SRO layer 430-1. By employing this structure, p+ body contact area 417 is enlarged to wrap the slope sidewalls and the bottom of said trenched source-body contact 414 to further enhance avalanche capability.

Figure 5:
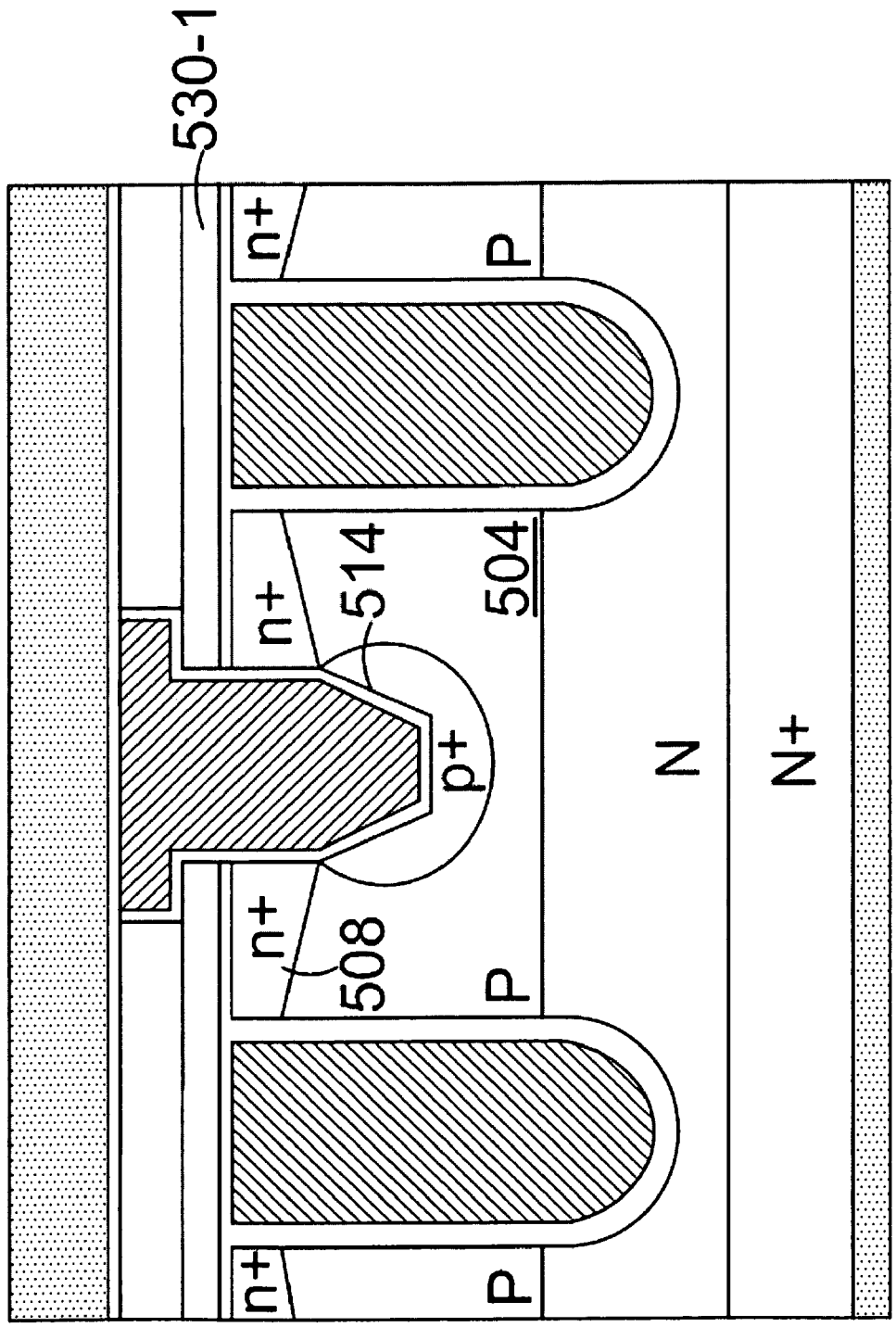
FIG. 5 is the side cross-sectional view of an N-channel trench MOSFET showing another preferred embodiment according to the present invention.

Please refer to FIG. 5 for another embodiment of the present invention where the N-channel trench MOSFET is similar to that in FIG. 4 except that, the trenched source-body contact 514 has slope sidewalls only in P body region 504 and has vertical sidewalls in n+ source region 508 and un-doped SRO layer 530-1 to prevent the dopant neutralization may introduced by the slope sidewalls in n+ source region in FIG. 4 when implanting p+ body contact area which will result in high source contact resistance.

Figure 6:
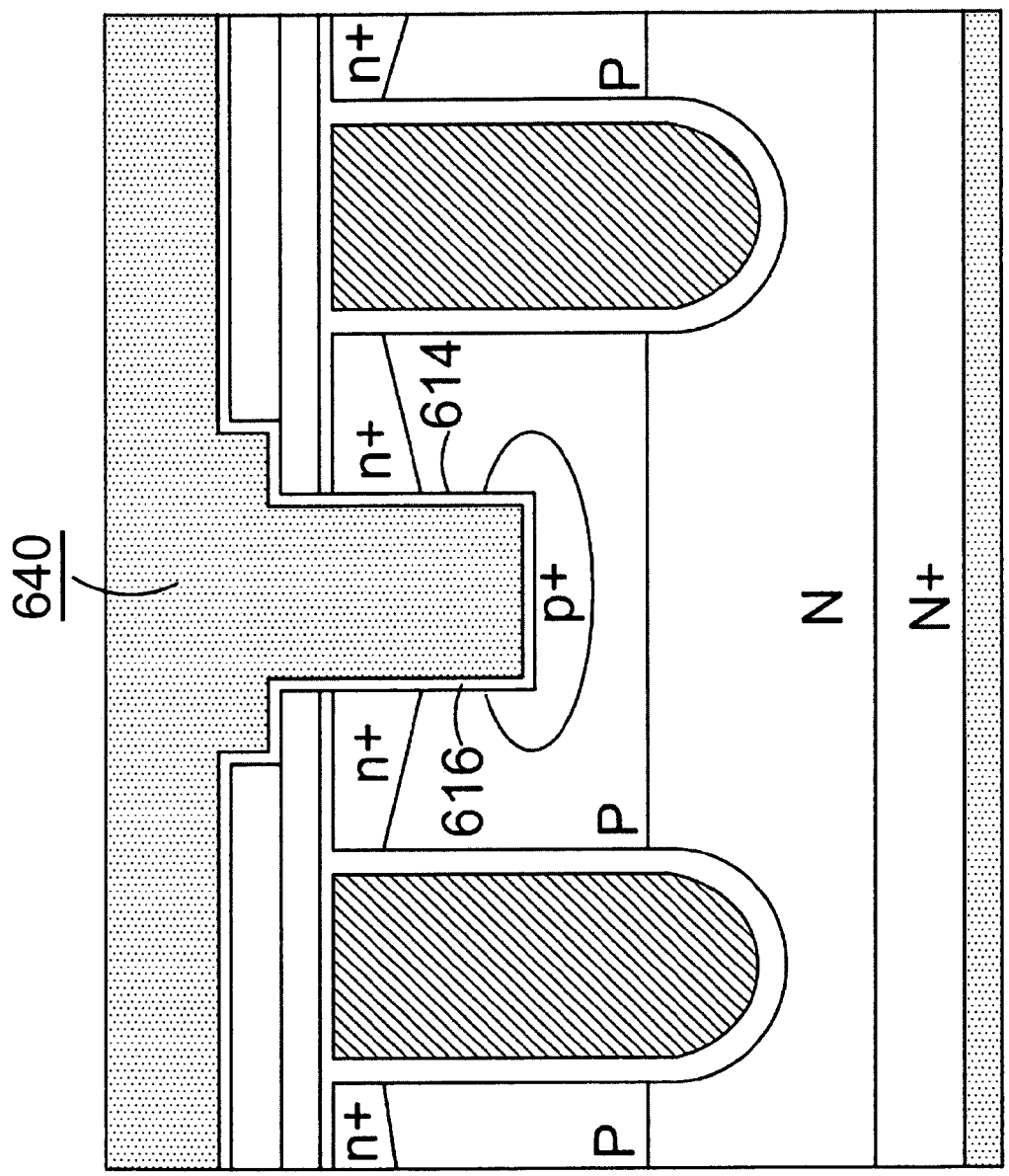
FIG. 6 is the side cross-sectional view of an N-channel trench MOSFET showing another preferred embodiment according to the present invention.

Please refer to FIG. 6 for a preferred embodiment of the present invention where the N-channel trench MOSFET is similar to that in FIG. 3A except that, each of the trenched source-body contacts 614 is not filled with W plug but the source metal 640 over a barrier layer 616.

Figure 7:
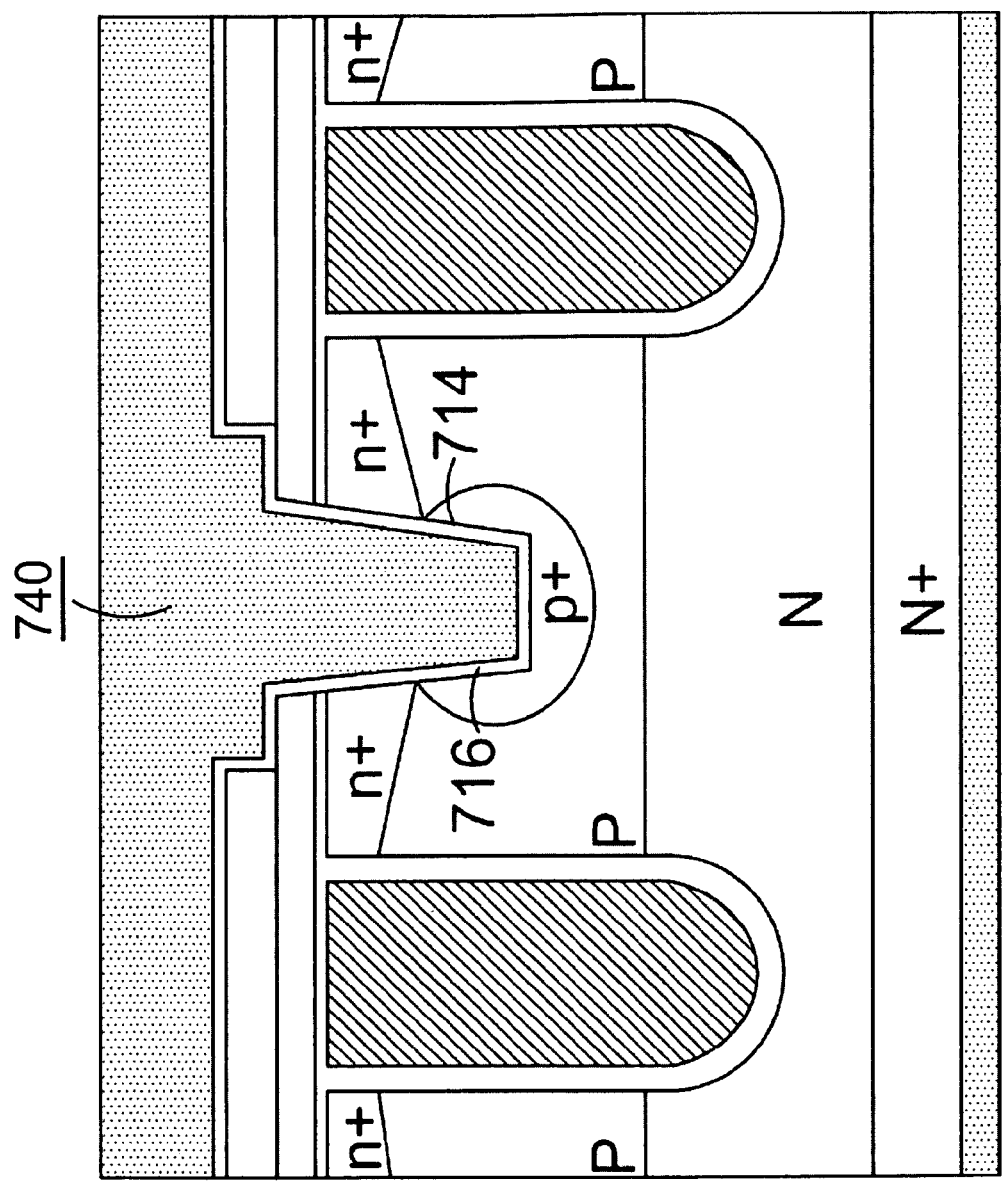
FIG. 7 is the side cross-sectional view of an N-channel trench MOSFET showing another preferred embodiment according to the present invention.

Please refer to FIG. 7 for a preferred embodiment of the present invention where the N-channel trench MOSFET is similar to that in FIG. 4 except that, each of the trenched source-body contacts 714 is not filled with W plug but the source metal 740 over a barrier layer 716.

Figure 8:
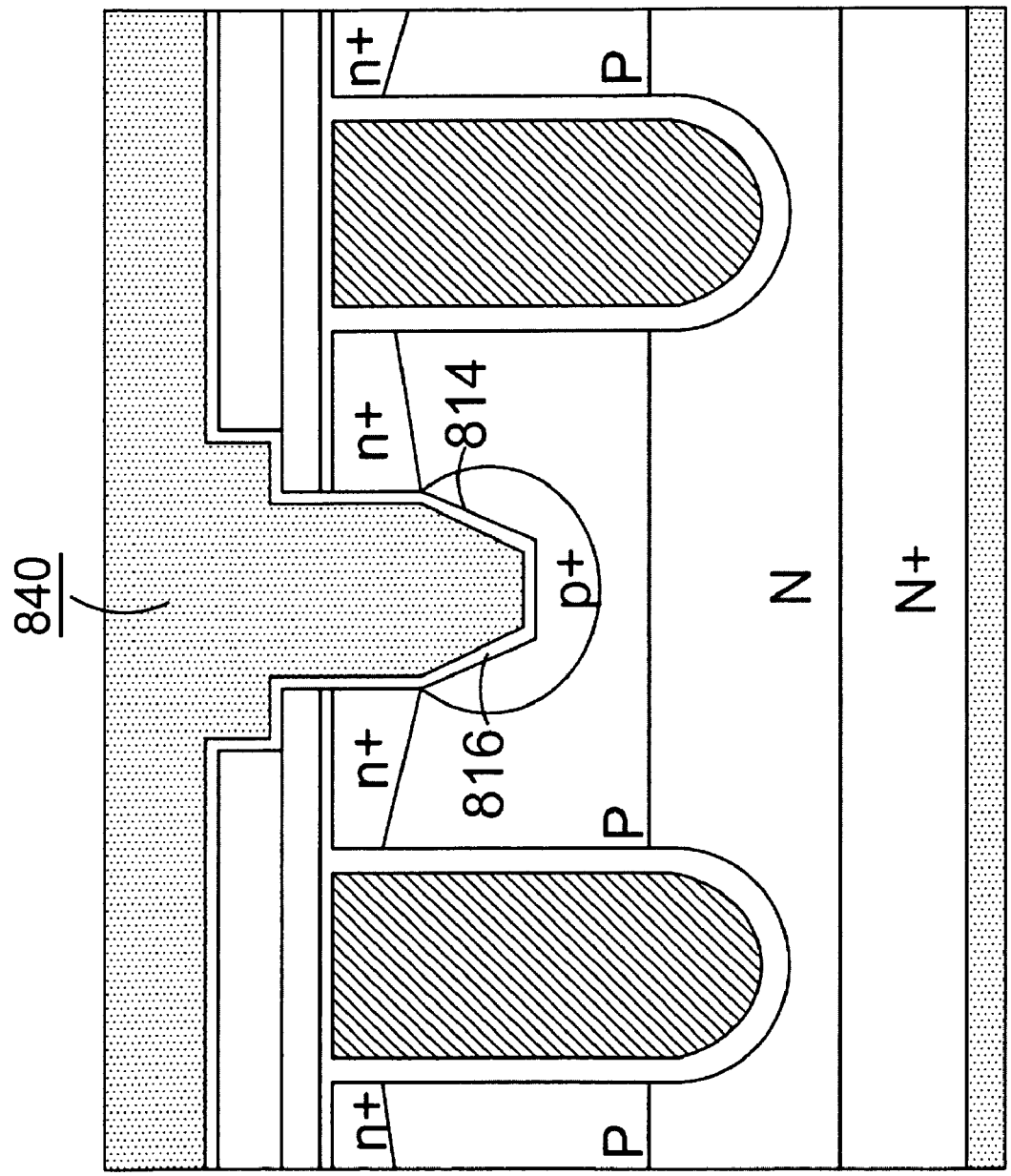
FIG. 8 is the side cross-sectional view of an N-channel trench MOSFET showing another preferred embodiment according to the present invention.

Please refer to FIG. 8 for a preferred embodiment of the present invention where the N-channel trench MOSFET is similar to that in FIG. 5 except that, each of the trenched source-body contacts 814 is not filled with W plug but the source metal 840 over a barrier layer 816.

Figure 9A:
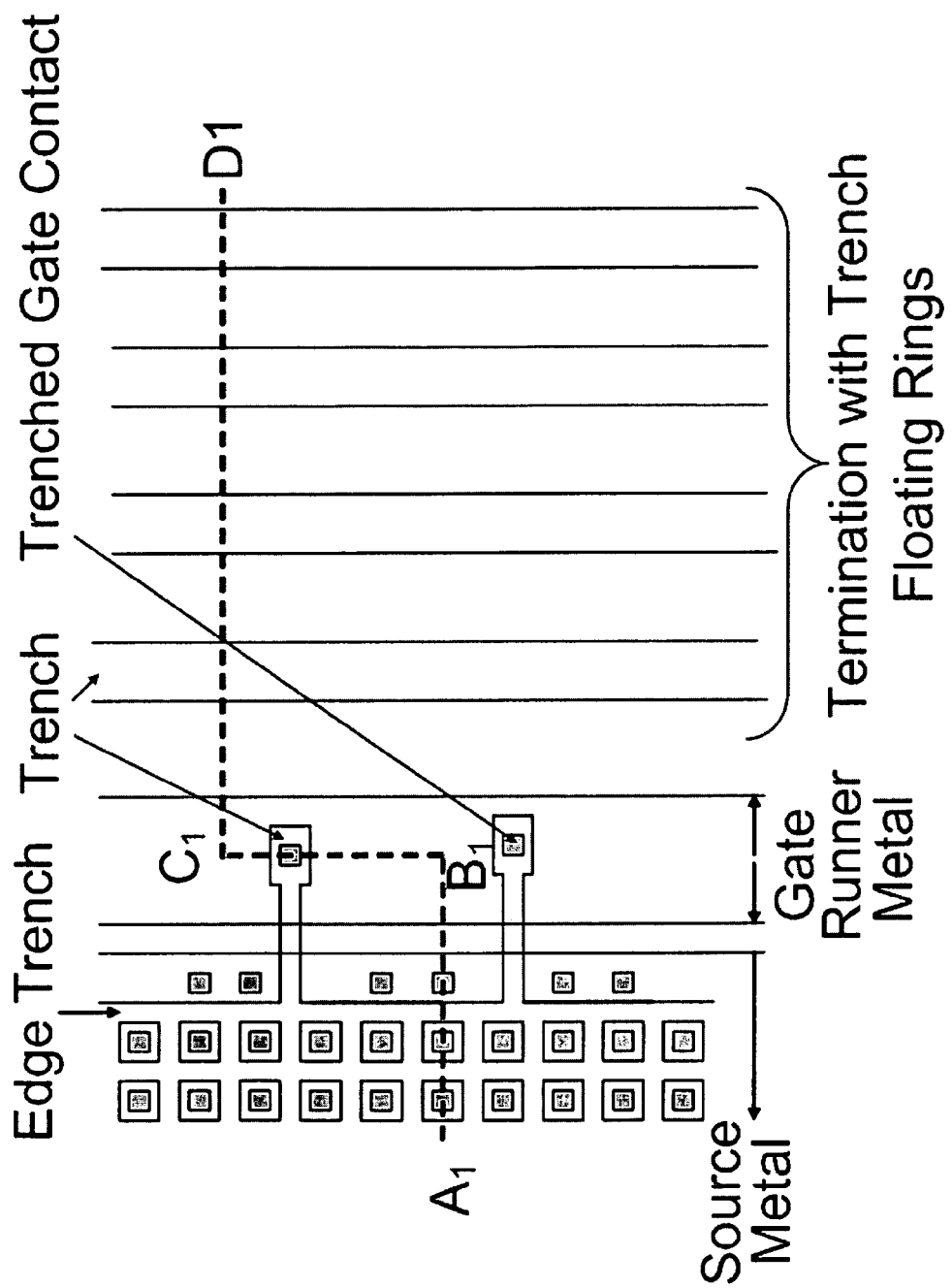
FIG. 9A is the top view of a preferred embodiment with closed cells according to the present invention.
Figure 9B:
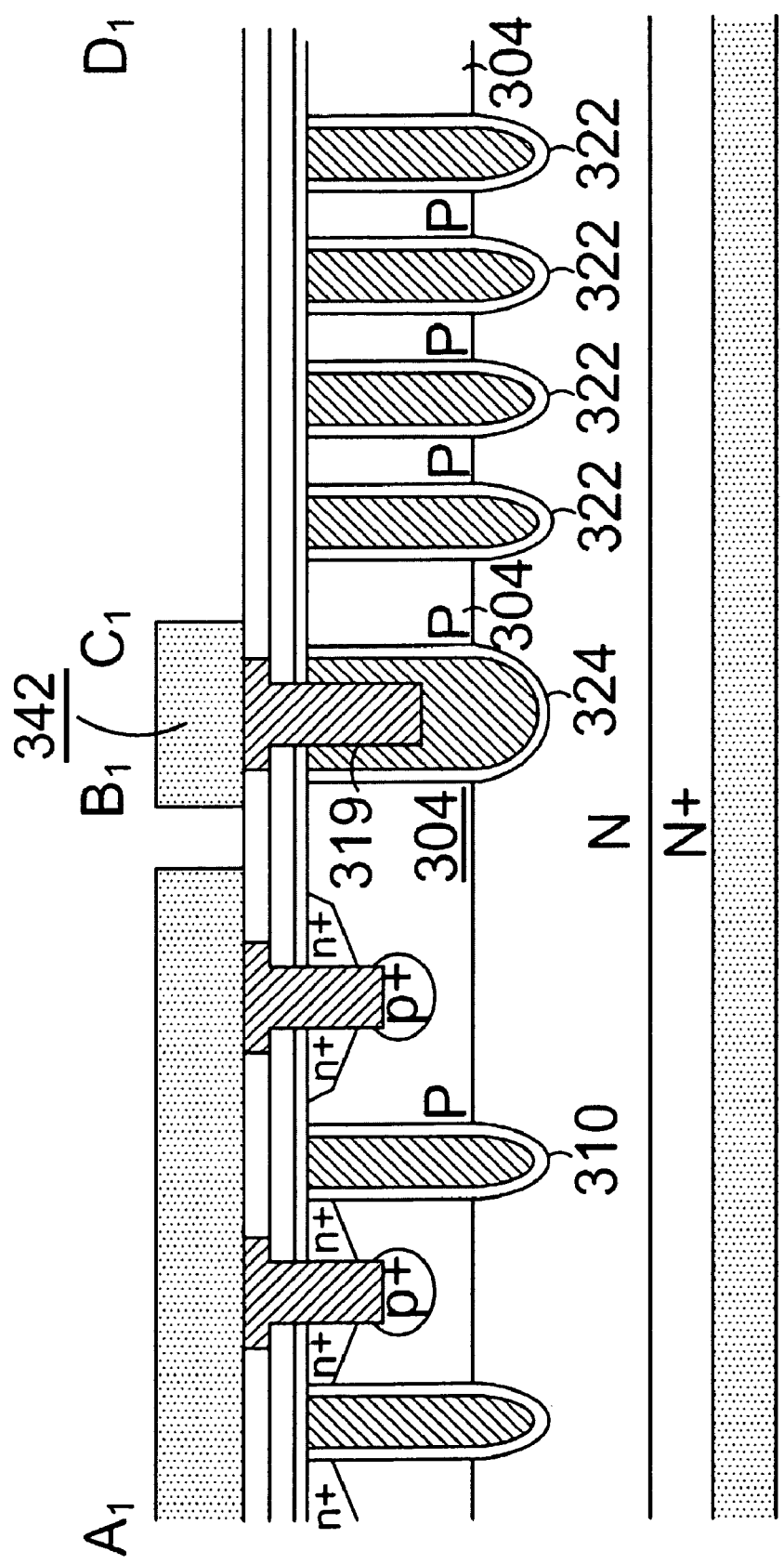
FIG. 9B is the side cross-sectional view of an N-channel trench MOSFET showing the $A_1$-$B_1$-$C_1$-$D_1$ cross section in FIG. 9A.

FIG. 9B shows an N-channel trench MOSFET with termination area according to the present invention, which is also the $A_1$-$B_1$-$C_1$-$D_1$ cross section of FIG. 9A. The N-channel trench MOSFET in FIG. 9B has an active area same as FIG. 3A and a termination area comprising a plurality of third trenched floating gates 322 filled with doped poly over gate oxide encompassed in P body region without n+ source region wherein. Trench depth of the third trench floating gates 322 is equal to or deeper than junction depth of the P body region 304. Trench width of the third trench floating gates 322 is equal to or wider than that of the first trenched gates 310 in the active area. The N-channel trench MOSFET further comprises at least a wider second trenched gate 324 filled with doped poly over gate oxide between said active area and said termination area to connected to gate metal 342 via trenched gate contact 319 filled with W plug.

Figure 10A:
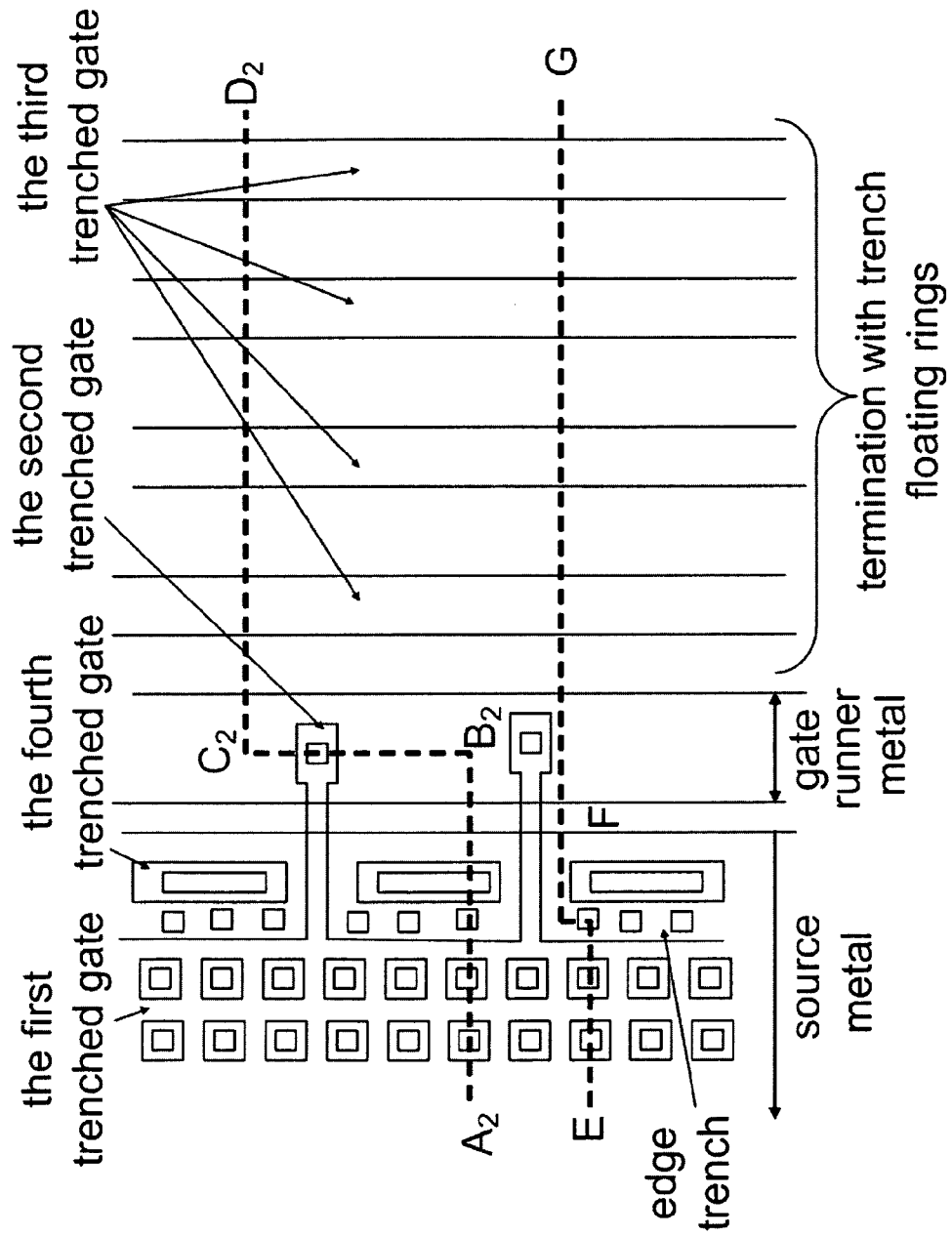
FIG. 10A is the top view of another preferred embodiment with closed cells according to the present invention.
Figure 10B:
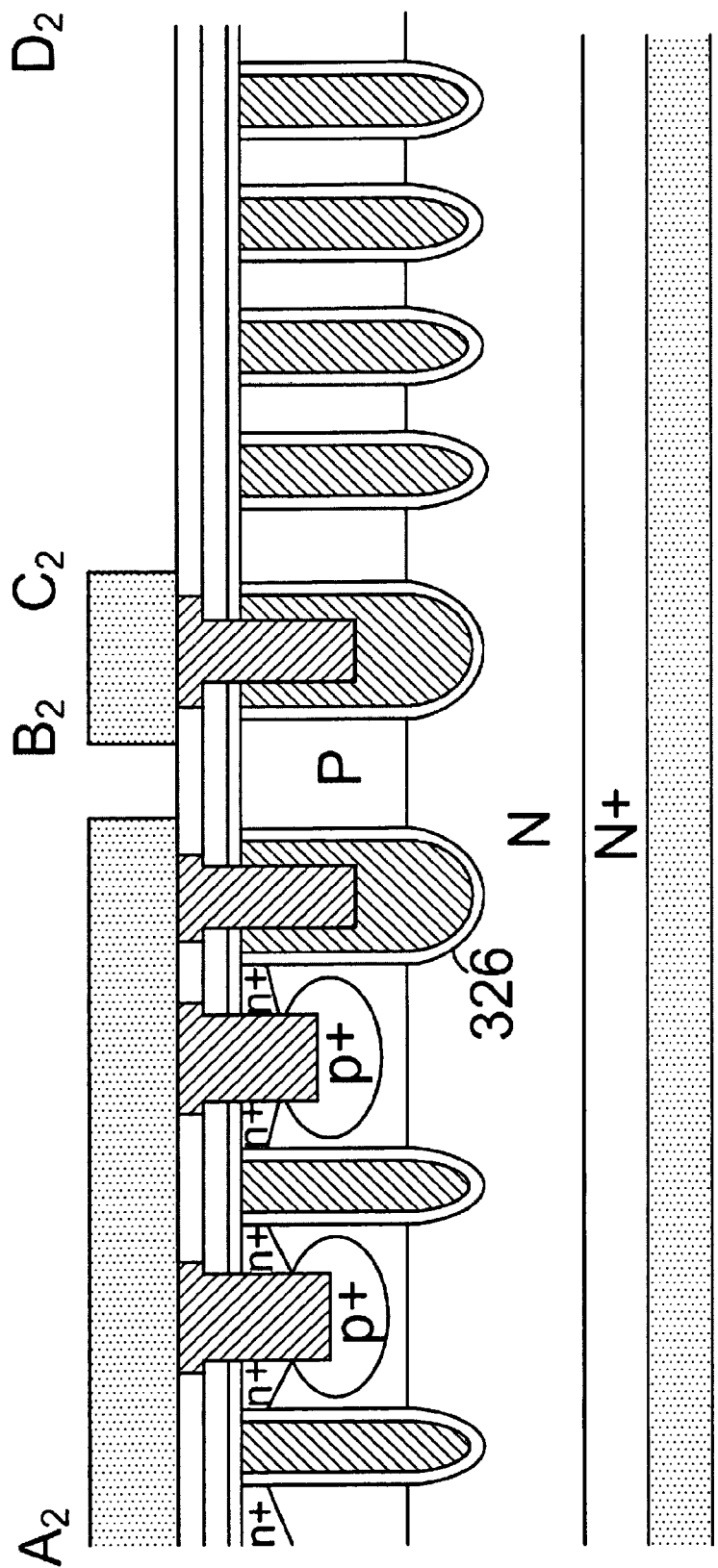
FIG. 10B is the side cross-sectional view of an N-channel trench MOSFET showing the $A_2$-$B_2$-$C_2$-$D_2$ cross section in FIG. 10A.

FIG. 10B shows an N-channel trench MOSFET with termination area according to the present invention, which is also the $A_2$-$B_2$-$C_2$-$D_2$ cross section of FIG. 10A. Comparing to FIG. 9B, the N-channel trench MOSFET in FIG. 10B further comprises a fourth trenched gate 326 to block n+lateral diffusion at edge contact for improving avalanche capability. Furthermore, said fourth trenched gate 326 is shorted with source metal via a trenched contact.

Figure 10C:
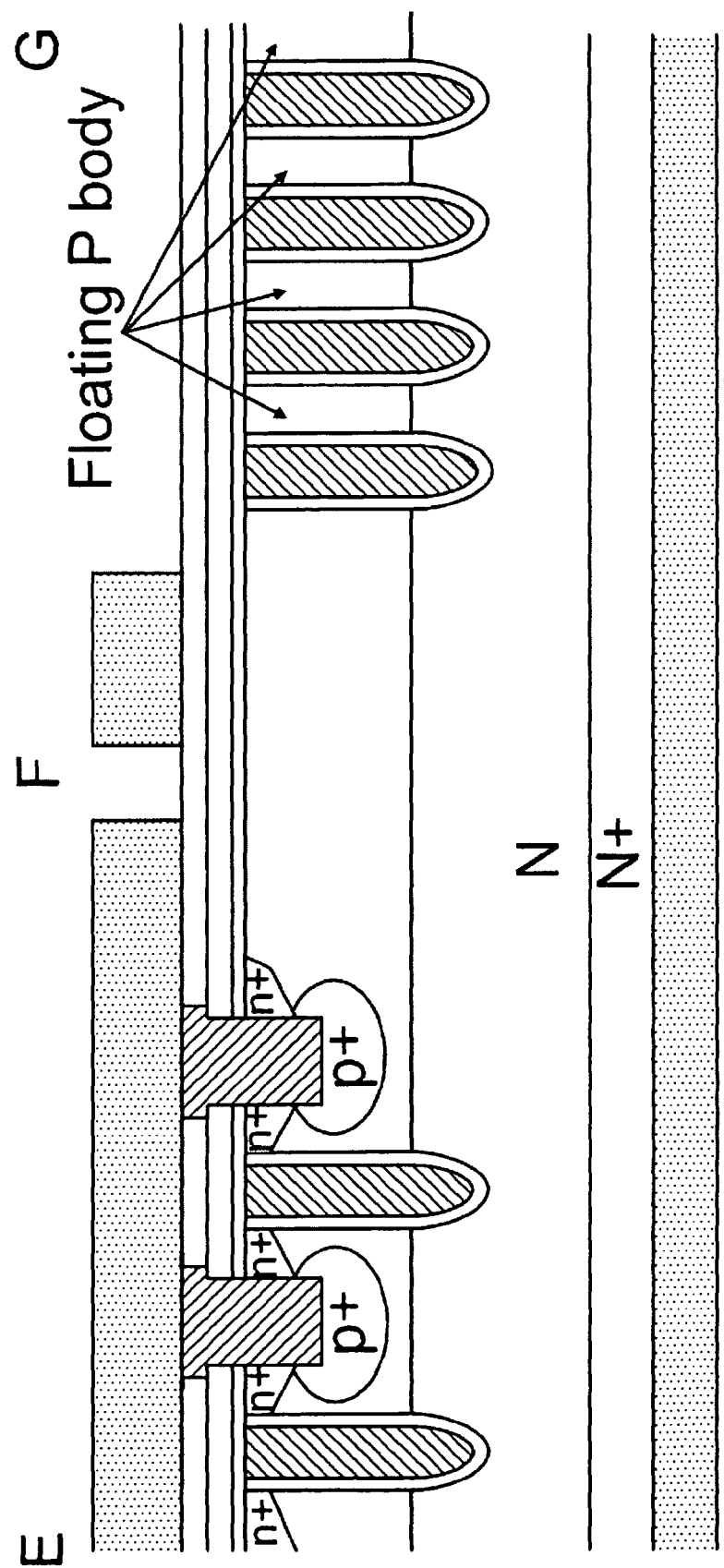
FIG. 10C is the side cross-sectional view of an N-channel trench MOSFET showing the E-F-G cross section in FIG. 10A.

FIG. 10C shows the E-F-G cross section of FIG. 10A, from which we can see that, the P body region next to said second trenched gate is shorted with source metal while the P body region in termination area has floating voltage.

Figure 11A:
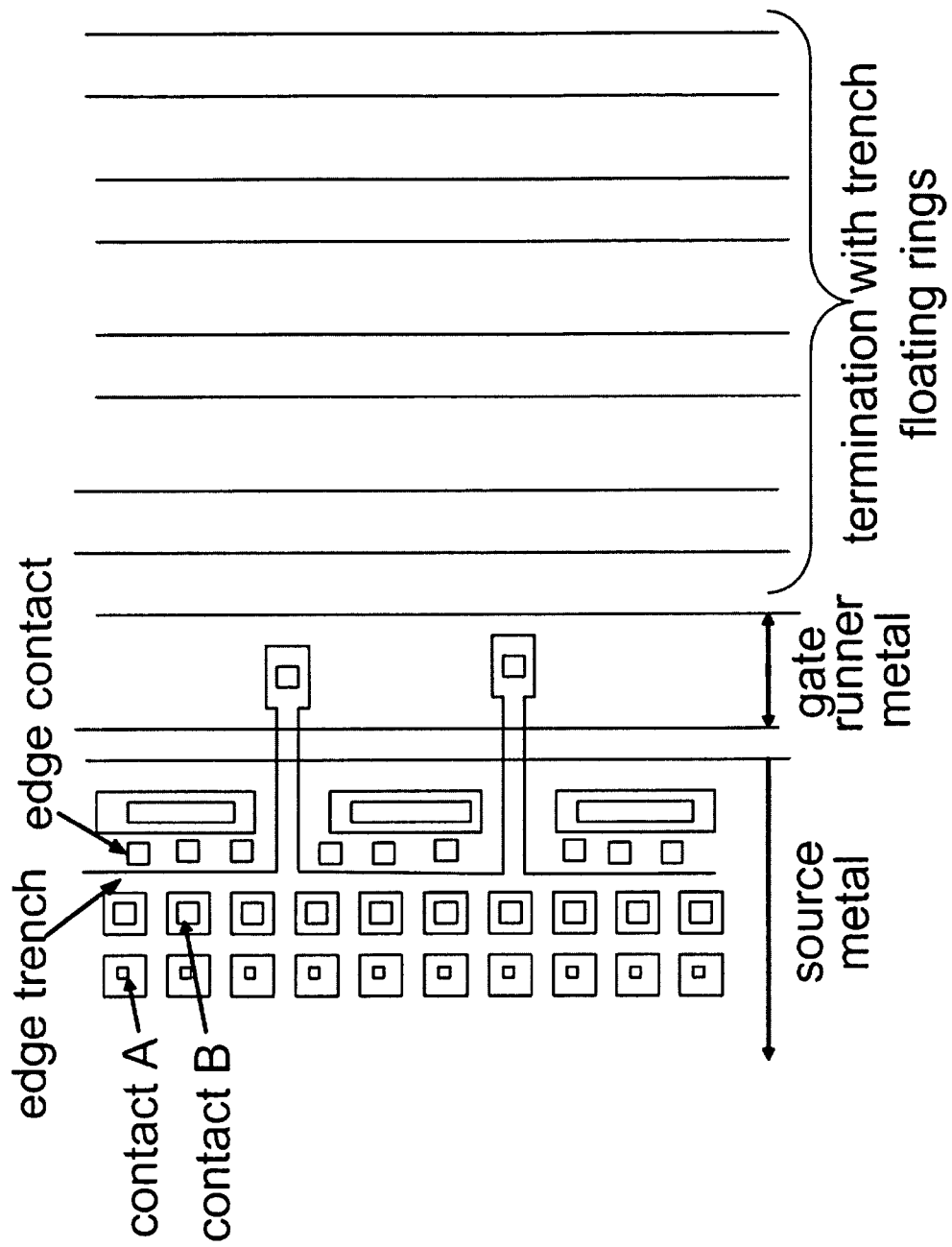
FIG. 11A is the top view of another preferred embodiment with closed cells according to the present invention.
Figure 11B:
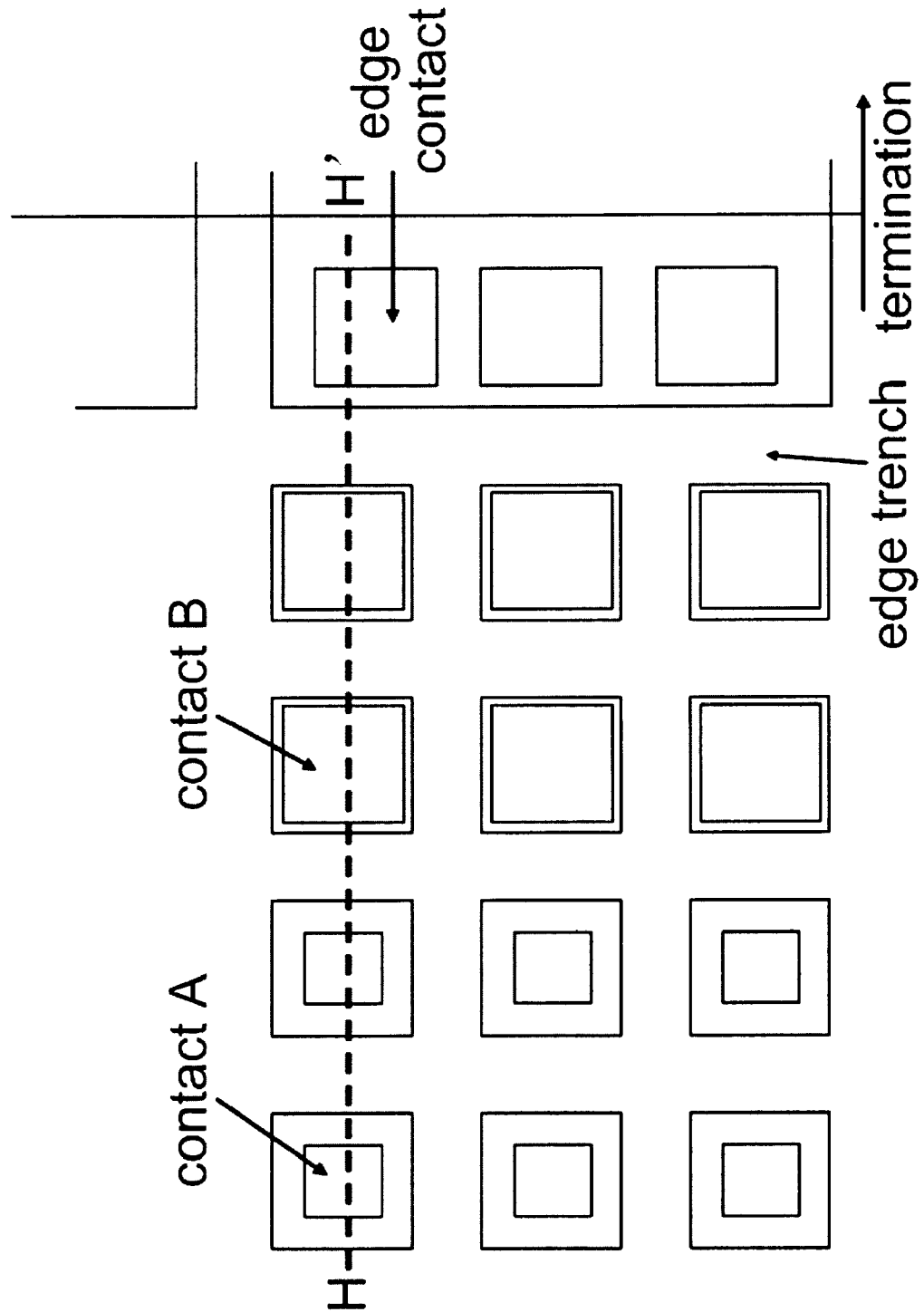
FIG. 11B is the top view showing the different contact width in FIG. 11A, at least one column or raw cells near edge contact has wider contact width than others.
Figure 11C:
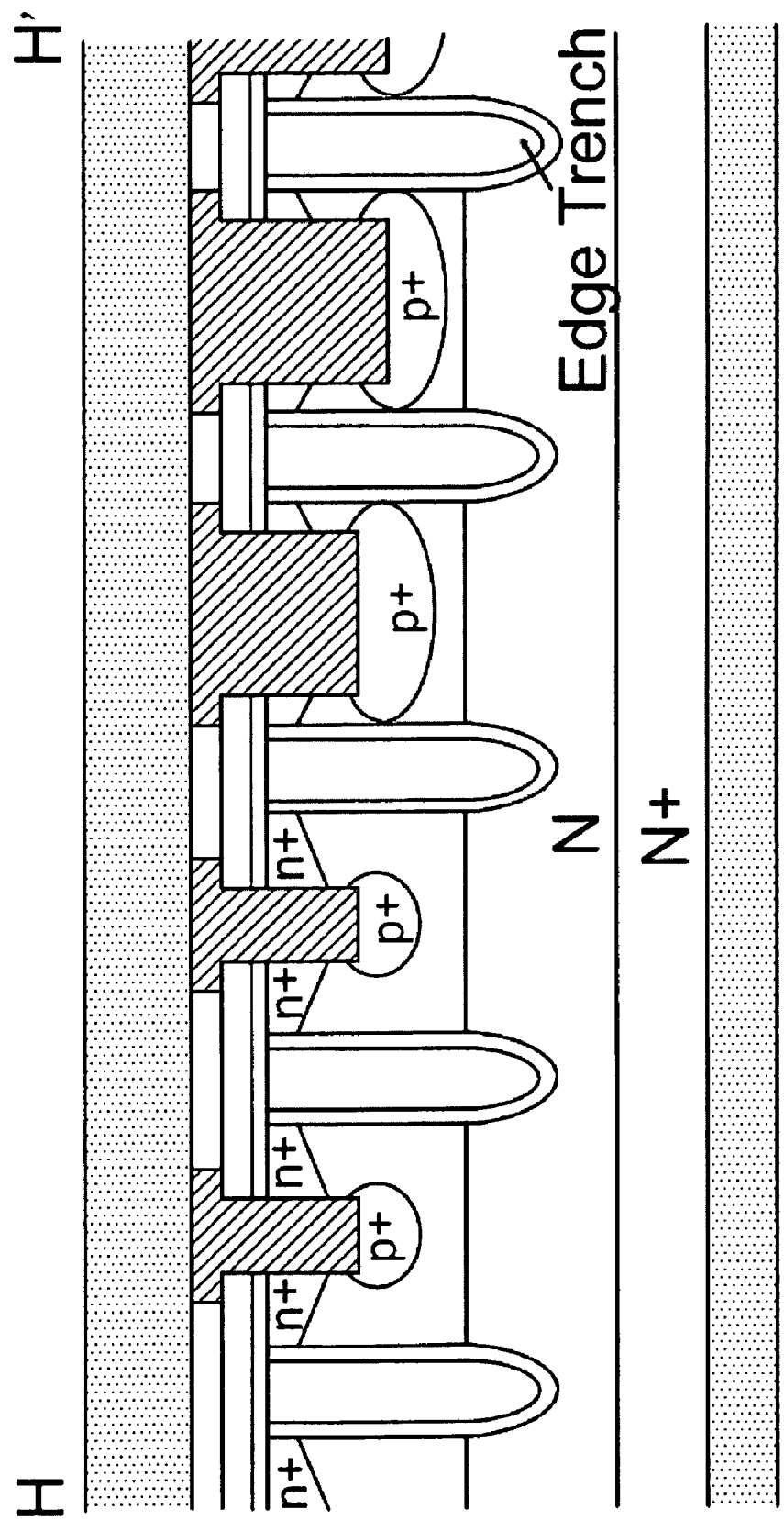
FIG. 11C is the side cross-sectional view of an N-channel trench MOSFET showing the H-H' cross section in FIG. 11B.

FIG. 11C shows active area of an N-channel trench MOSFET according to the present invention, which is also the H-H' cross section of FIG. 11B showing the trenched contact width of contact A (the same contact A in FIG. 11A) is smaller than trenched contact width of contact B (the same contact B in FIG. 11A) adjacent to edge trench. Therefore, in FIG. 11C, the p+ body contact area underneath trenched source-body contact in the first two cells adjacent to the edge trench serving as buffer cells is closer to the first trenched gate than normal cells, and the Vth of said buffer cells is thus higher due to the p+ body contact area touching to channel region so that the buffer cells will not be turned on first when gate is biased.

Figure 12:
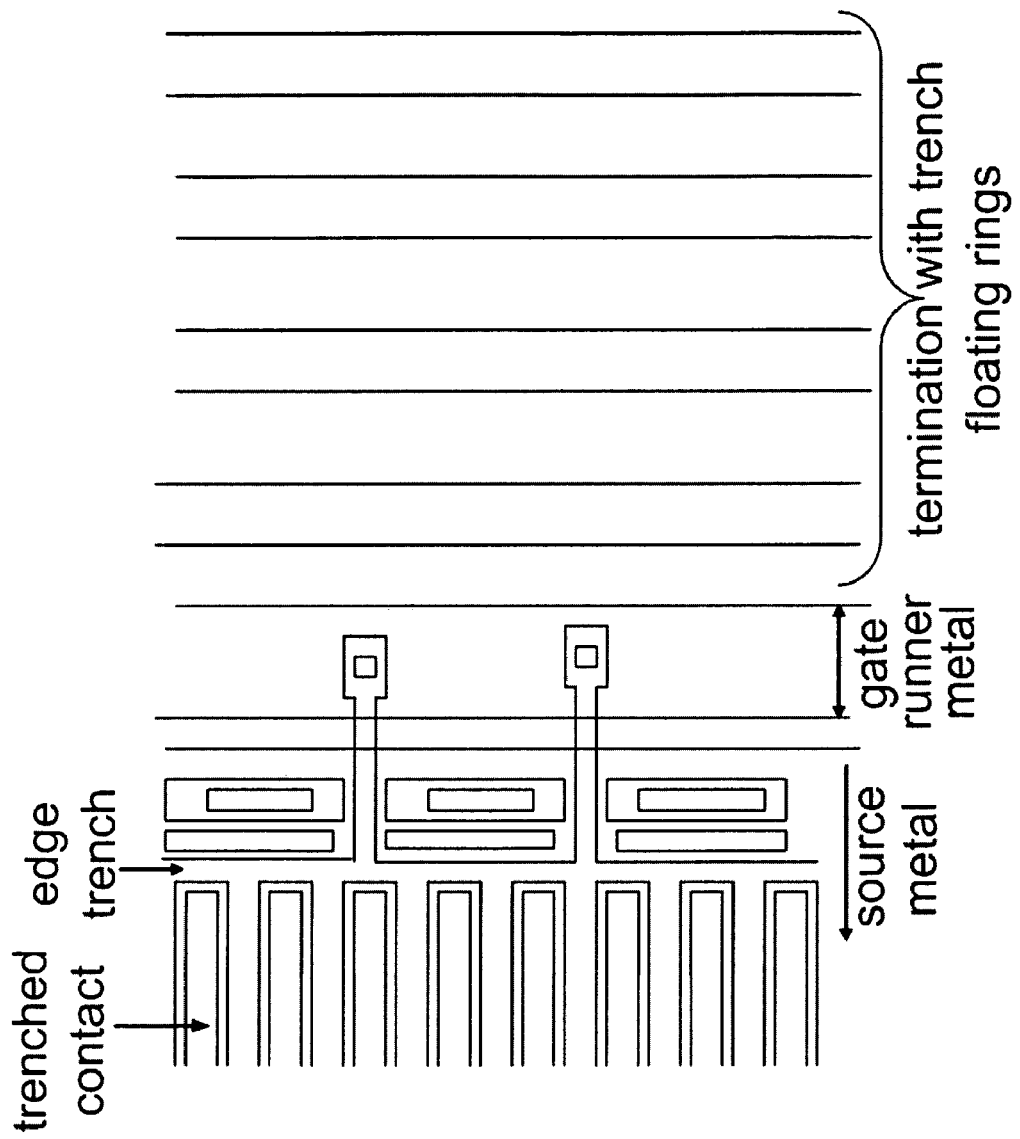
FIG. 12 is the top view of another preferred embodiment with stripe cells according to the present invention.
Figure 13:
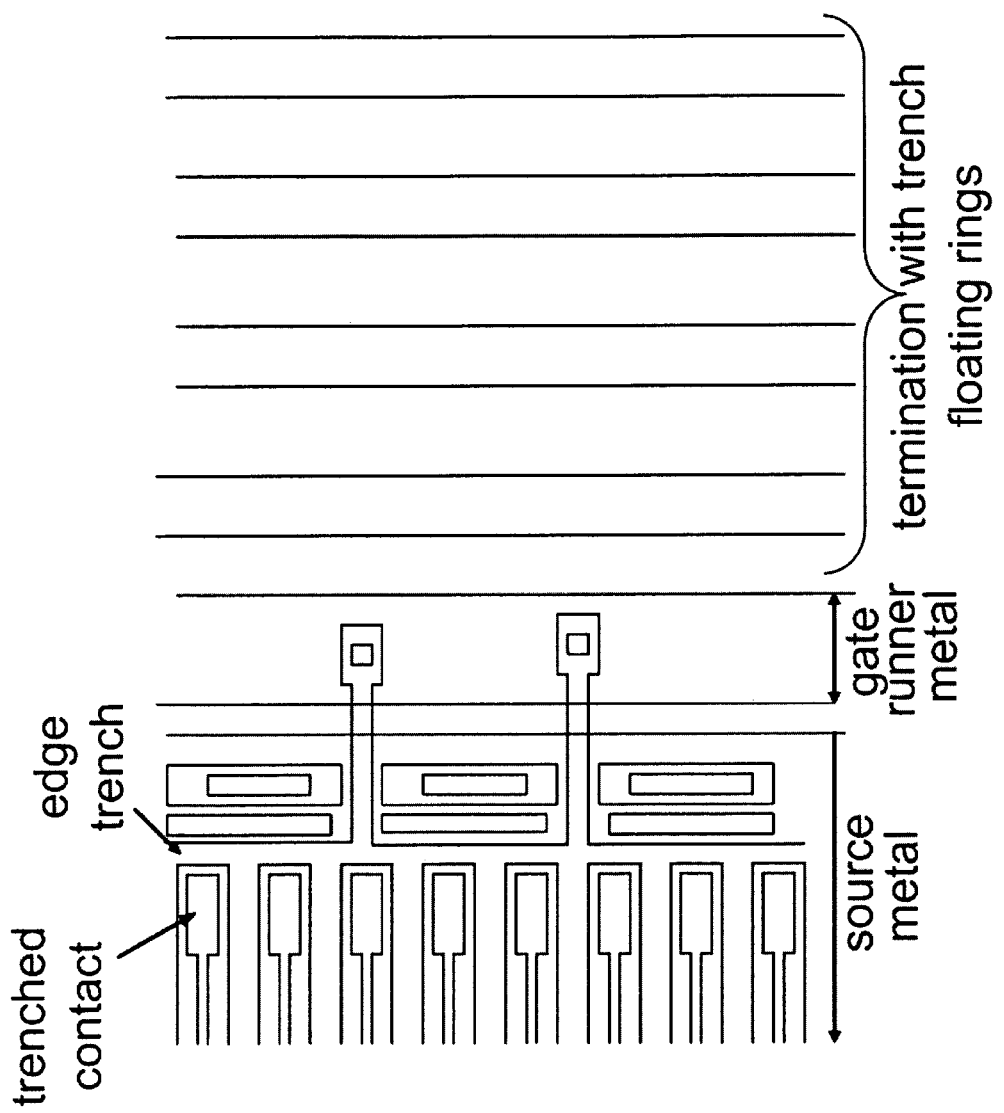
FIG. 13 is the top view of another preferred embodiment with stripe cells according to the present invention.

As the same to stripe cells, comparing to FIG. 12 with uniform trenched contact width in active area, the top view in FIG. 13 shows the preferred embodiment with stripe cells having larger trenched contact width near edge trench.

Figure 14A:
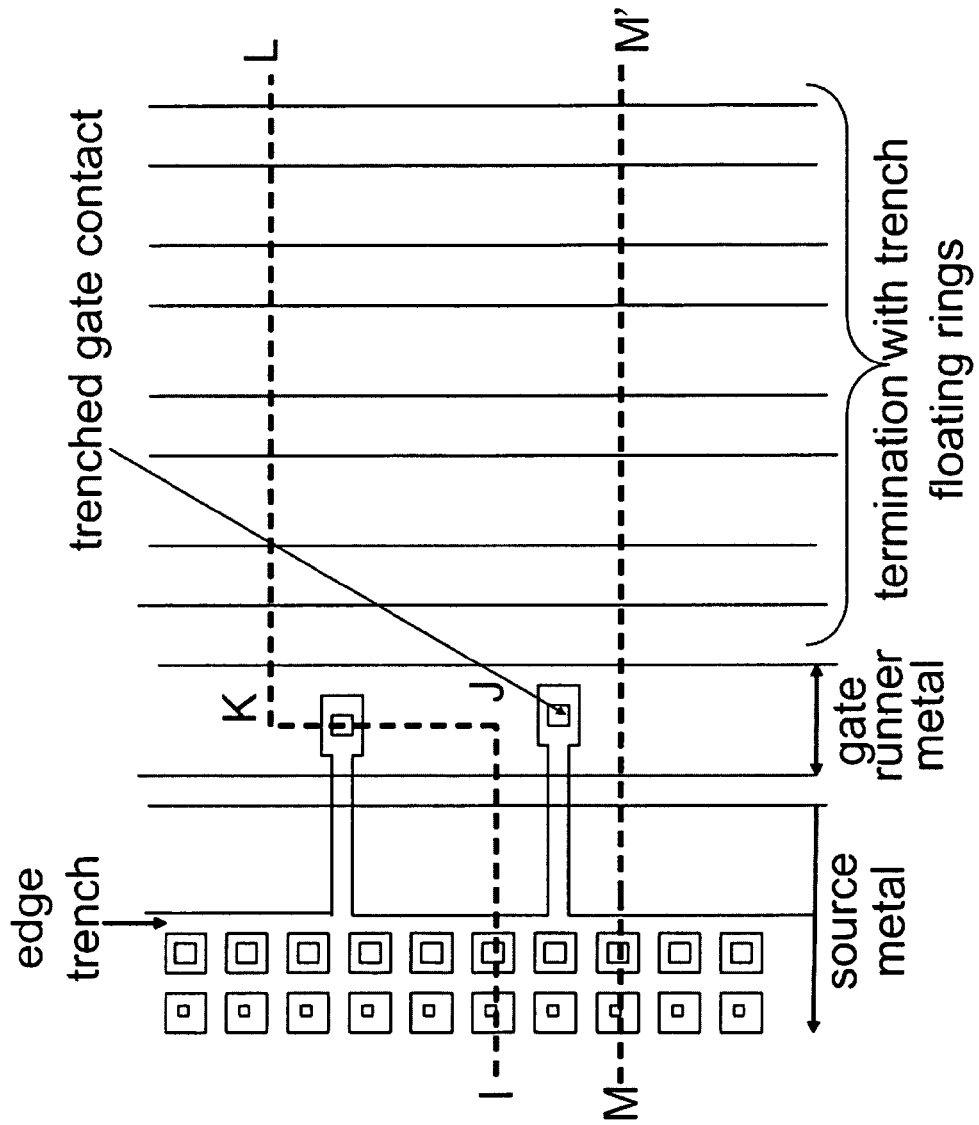
FIG. 14A is the top view of another preferred embodiment with closed cells according the present invention.
Figure 14B:
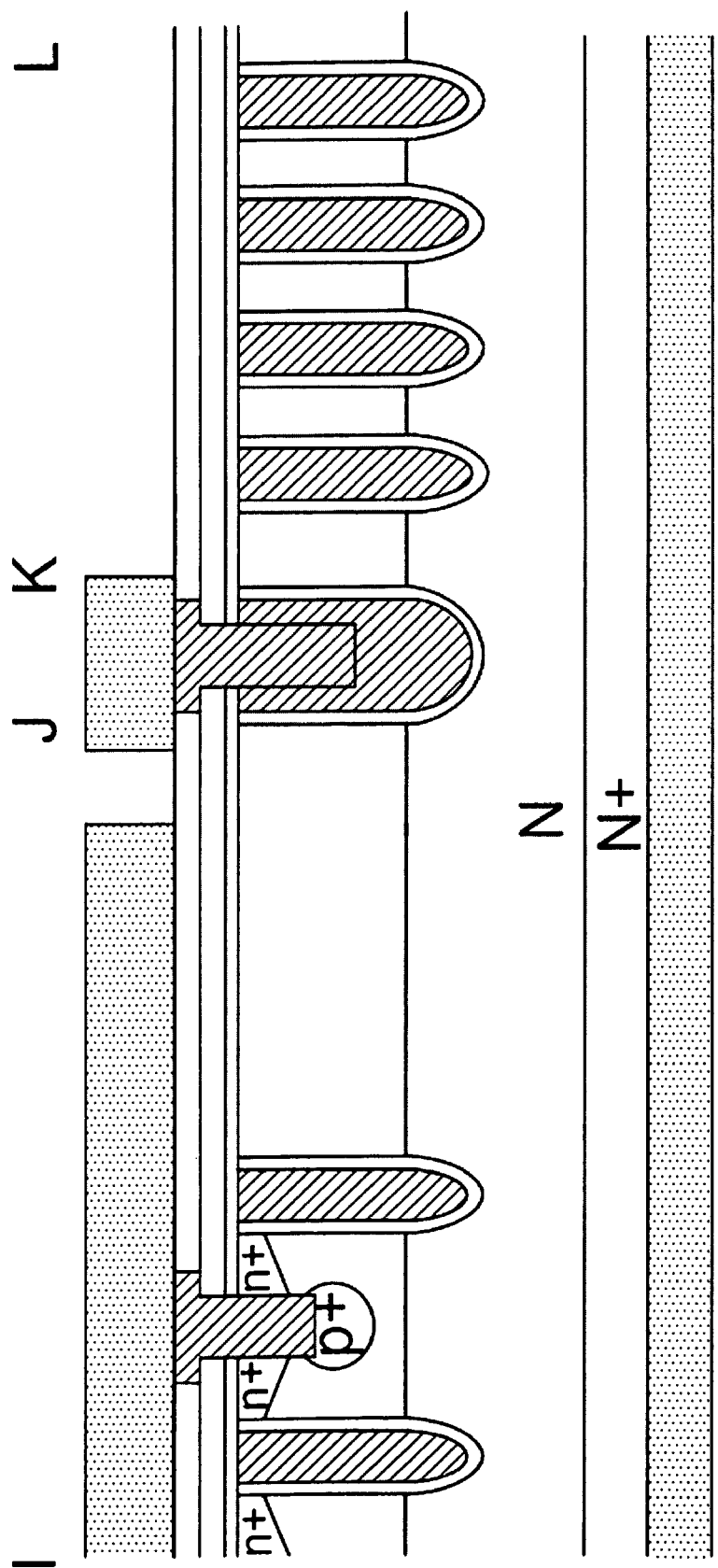
FIG. 14B is the side cross-sectional view of an N-channel MOSFET showing the I-J-K-L cross section in FIG. 14A.
Figure 14C:
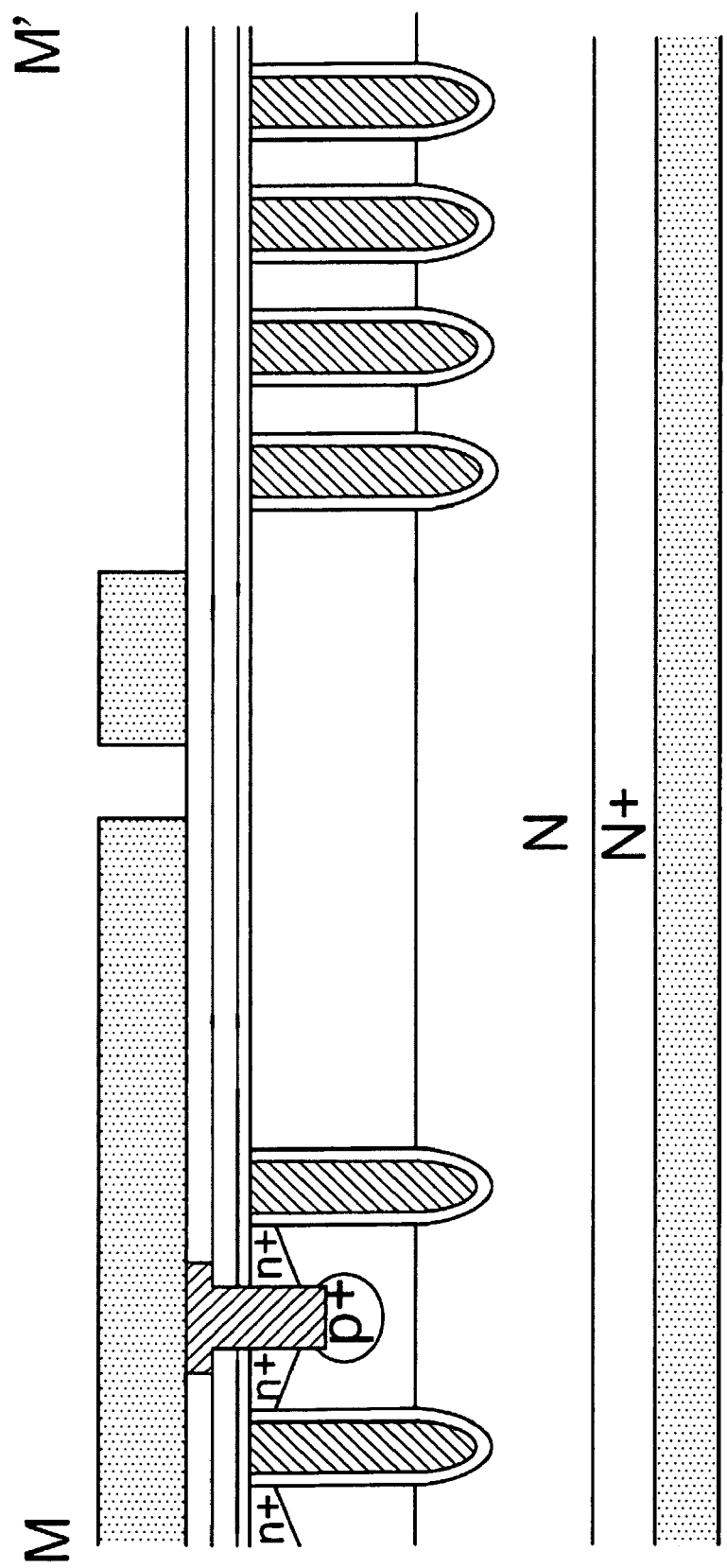
FIG. 14C is the side cross-sectional view of an N-channel MOSFET showing the M-M' cross section in FIG. 14A.

FIG. 14B shows an N-channel trench MOSFET with termination area according to the present invention, which is also the I-J-K-L cross section in FIG. 14A. Comparing to FIG. 9B, the N-channel trench MOSFET in FIG. 14B dose not have edge contact wherein, therefore the P body region between the second trenched gate and the adjacent first trenched gate are floating, which can be also seen from FIG. 14C, the M-M' cross section in FIG. 14A.

Figure 15:
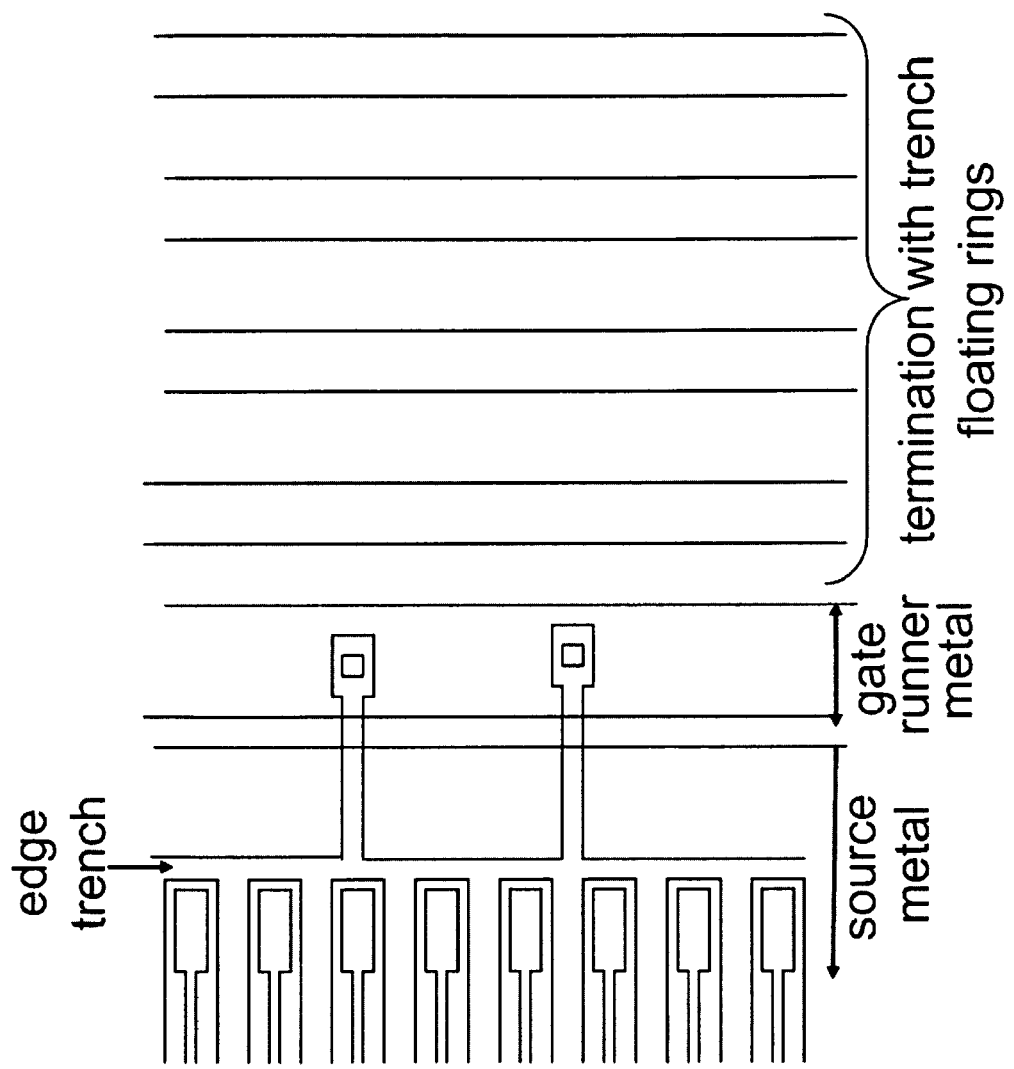
FIG. 15 is the top view of another preferred embodiment with stripe cells according to the present invention.

As the same to stripe cells, FIG. 15 shows the top view of an N-channel trench MOSFET without edge contact wherein.

Figure 16A:
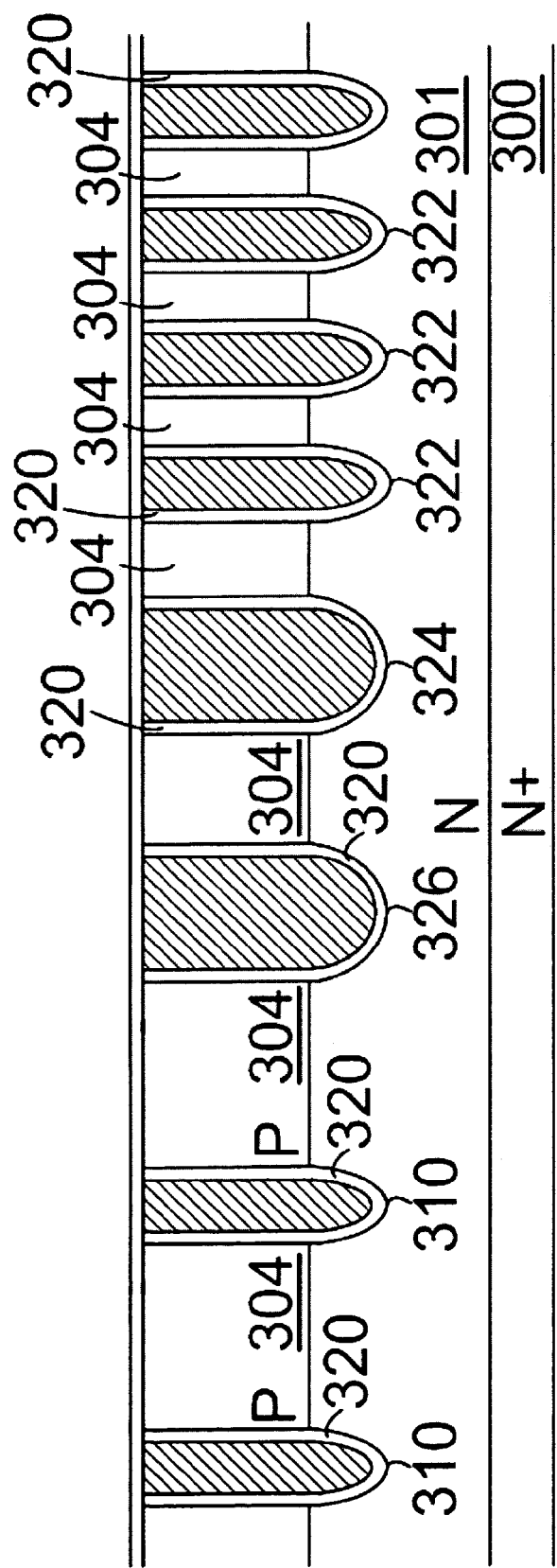
FIGS. 16A-16D are a serial of side cross-sectional views for showing the processing steps for fabricating the trench MOSFET as shown in FIG. 10B.

FIG. 16A to 16D are a serial of exemplary steps that are performed to form the preferred N-channel trench MOSFET in FIG. 10B. In FIG. 16A, an N doped epitaxial layer 301 is grown on an N+ substrate 300. After applying a trench mask (not shown), a plurality of gate trenches are etched to a certain depth into N epitaxial layer 301. Then, a sacrificial oxide layer is grown and then removed to eliminate the plasma damage may introduced during etching process. Next, a first insulation layer is deposited overlying the inner surface of said plurality of gate trenches to serve as gate oxide 320, onto which doped poly is deposited filling said plurality of gate trenches and then etched back by CMP (Chemical Mechanical Polishing) or plasma etching to form a plurality of first trenched gates 310, at least a wider second trenched gate 324, a plurality of third trenched gates 322 and a fourth trenched gate 326. Then, over the entire top surface, a step of P body dopant Ion Implantation is carried out for the formation of P body regions 304 followed by a P body dopant diffusion for drive-in.

Figure 16B:
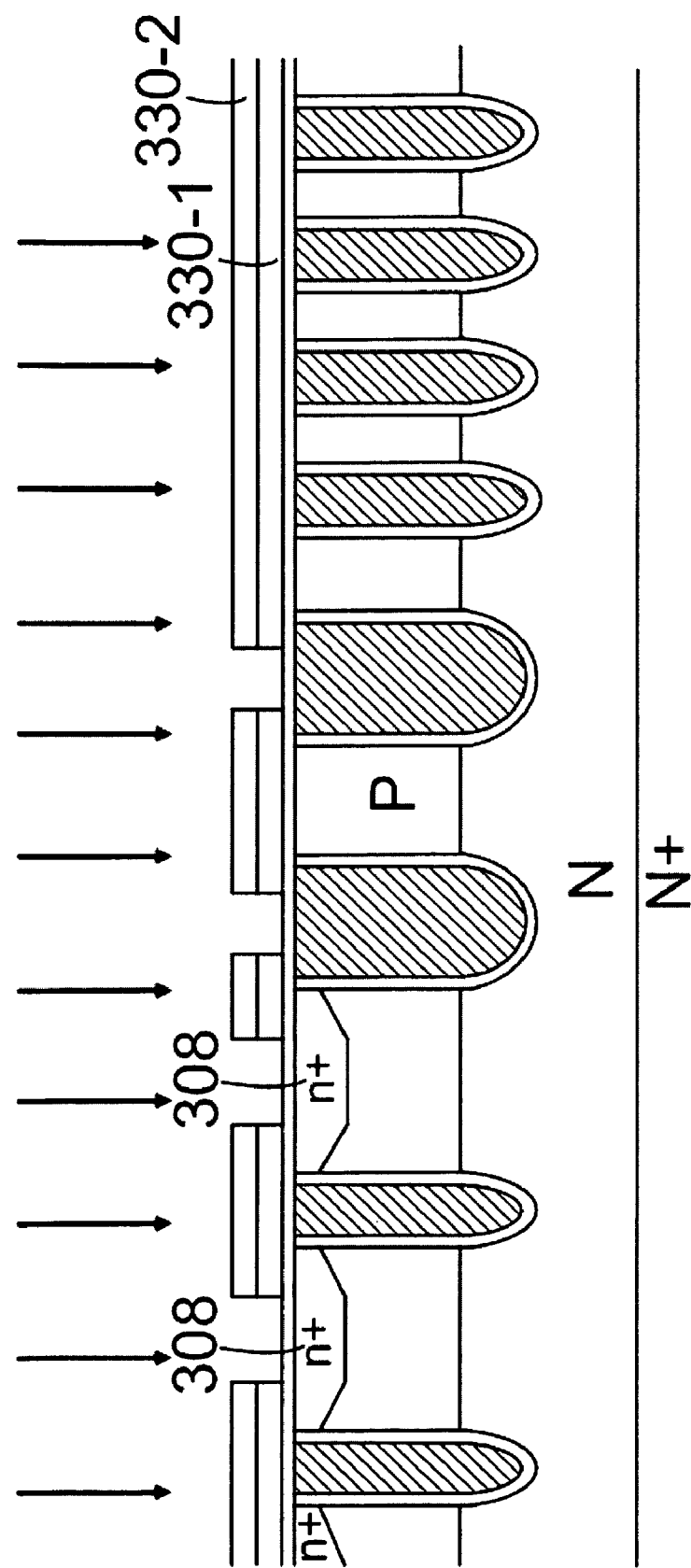

In FIG. 16B, an un-doped SRO layer 330-1 and a BPSG or PSG layer 330-2 are successively deposited onto top surface of said epitaxial layer. Then, after a contact mask (not shown) is applied, said un-doped SRO layer 330-1 and said BPSG or PSG layer 330-2 are etched to define a plurality of contact trenches. Next, after the removal of contact mask, a screen oxide which is about 300A, is deposited along the open areas and surface of said un-doped SRO layer 330-1 and said BPSG or PSG layer 330-2. Then, a step of n+ source dopant Ion Implantation is carried out over entire surface for the formation of n+ source region 308 followed by a diffusion of n+ source dopant for drive-in.

Figure 16C:
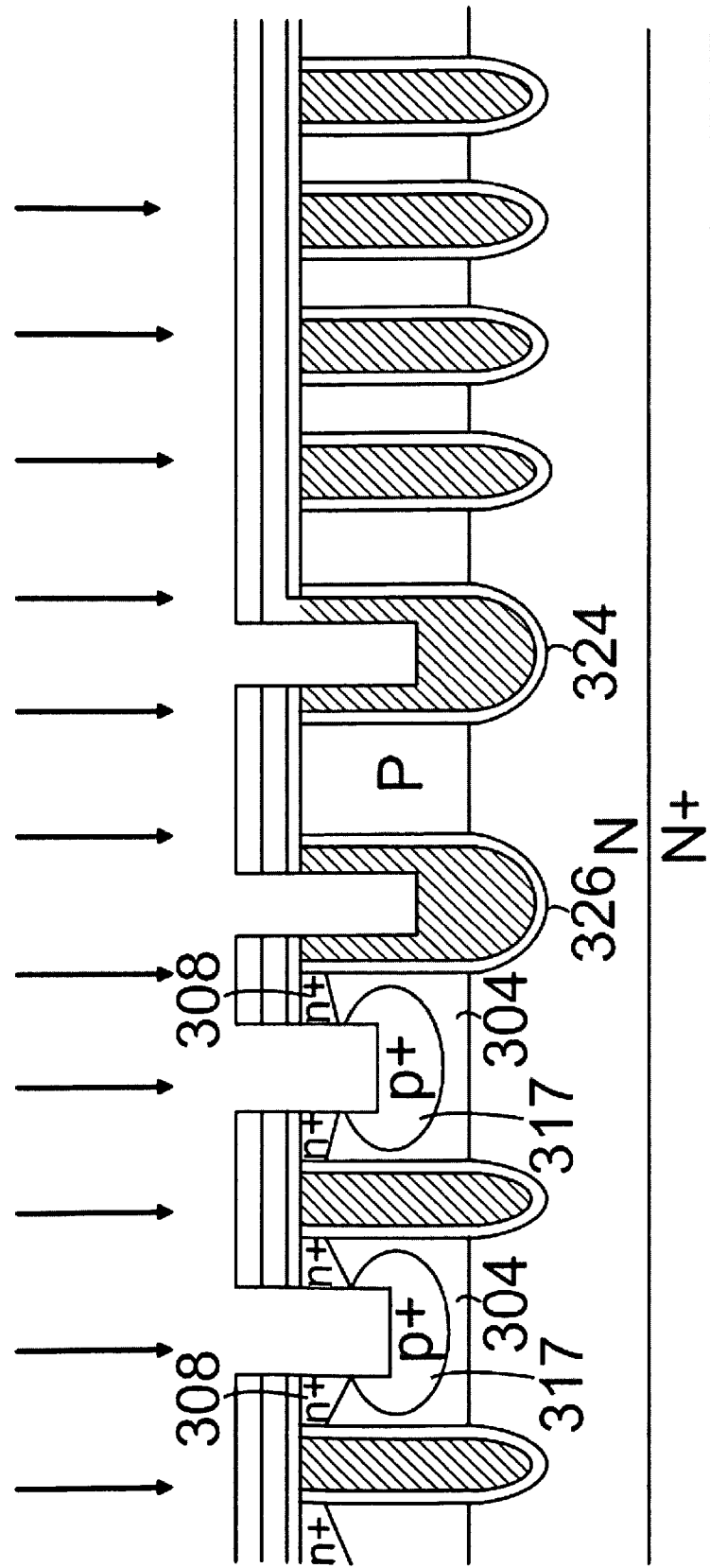

In FIG. 16C, the screen oxide is first removed by dry or wet oxide etching and another step of dry silicon etch is then carried out to etch said contact trenches into said source region 308, said body region 304, and doped poly in said second trenched gate 324 and said fourth trenched gate 326, respectively. After that, BF2 Ion Implantation is carried out over entire top surface to form p+ body contact area 317 followed by a step of RTA (Rapid Thermal Annealing) to active implanted dopant.

Figure 16D:
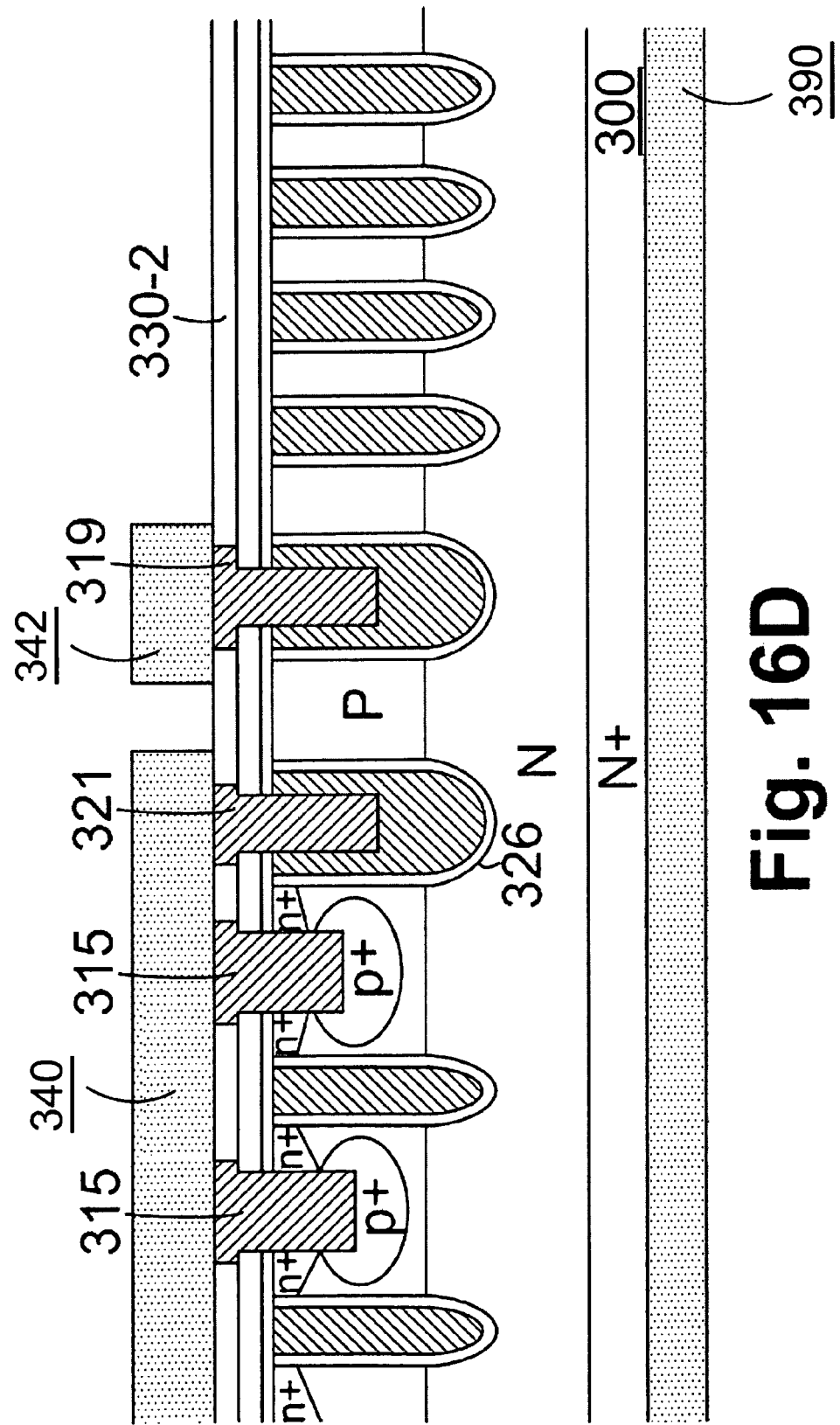

In FIG. 16D, wet etching in dilute HF is first carried out to enlarge the trenched contact width in BPSG or PSG layer 330-2. Then, a barrier layer 316 of Ti/TiN or Co/TiN or Ta/TiN and contact filling-in material W is successively deposited and then etched back to form W plugs 315 in trenched source-body contacts, W plug 319 in trenched gate contact and W plug 321 extending into said fourth trenched gate 326. Then, a metal layer of Al alloys or Cu alloys is deposited after Ti or Co silicide formation by RTA, over a resistance-reduction layer of Ti or Ti/TiN and patterned by a metal mask (not shown) to form source metal 340 and gate metal 342 by metal etching. Last, after the backside grinding, back metal 390 of Ti/Ni/Ag is deposited onto the rear side of said substrate 300.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A trench semiconductor power MOSFET comprising a plurality of transistor cells with each cell composed of a plurality of first trenched gates surrounded by source regions heavily doped with a first conductivity type in an active area encompassed in a body regions of a second conductivity type above a drain region disposed on a bottom surface of a low-resistivity substrate of said first conductivity type, wherein:

said plurality of transistor cells formed in an epitaxial layer with said first conductivity type over said low-resistivity substrate, and with a lower doping concentration than said low-resistivity substrate;

said source region has doping concentration along channel region lower than along trenched source-body contact region at same distance from the surface of said epitaxial layer, and source junction depth is shallower along said channel region than along said trenched source-body contact, and the doping profile of said source region along the surface of said epitaxial layer has Gaussian-distribution from said trenched source-body contact to said channel region;

said plurality of first trenched gates filled with doped poly padded with a first insulation layer as gate oxide; and each said transistor cell further comprising:

at least a second trenched gate having wider trench width than said first trenched gates and filled with doped poly padded with a first insulation layer as gate oxide;

a second insulation layer functioning as contact interlayer;

a plurality of trenched source-body contacts penetrating through said second insulation layer and said source regions, and extending into said body regions to contact both said source region and said body regions;

at least a trenched gate contact penetrating through said second insulation layer and extending into said doped poly in said second trenched gate;

a body contact area heavily doped with said second conductivity type around the bottom of each said trenched source-body contact;

said MOSFET has multiple trenched floating gates in a termination area composed of a plurality of third trenched gates filled with said doped poly padded with said gate oxide surrounded by said body regions wherein there is no said source between two adjacent said third trenched gates in said termination area;

trench depth of said multiple trenched floating gates is equal to or deeper than junction depth of said body regions, a source metal connected to said source regions and said body regions; and a gate metal connected to said second trenched gate.

2. The MOSFET of claim 1, wherein each of said trenched source-body contacts has vertical sidewalls in said source regions and said body regions.

3. The MOSFET of claim 1, wherein each of said trenched source-body contacts has slope sidewalls in said source regions and said body regions.

4. The MOSFET of claim 1, wherein each of said trenched source-body contacts has vertical sidewalls in said source regions, and has slope sidewalls in said body regions.

5. The MOSFET of claim 1, wherein said source metal and said gate metal is Al alloys or Cu alloys.

6. The MOSFET of claim 1, wherein said trenched source-body contacts and said trenched gate contact are filled with W (Tungsten) plugs padded by a barrier layer connecting with said source metal and said gate metal, respectively.

7. The MOSFET of claim 1, wherein said trenched source-body contacts and said trenched gate contact are filled with said source metal and said gate metal, respectively.

8. The MOSFET of claim 1, wherein each of said transistor cells further comprising a resistance-reduction layer Ti or Ti/TiN padded underneath said source metal and said gate metal, respectively.

9. The MOSFET of claim 1, wherein said transistor cell configuration is square or rectangular closed cell.

10. The MOSFET of claim 1, wherein said transistor cell configuration is stripe cell.

11. The MOSFET of claim 1, wherein trench width of said multiple trenched floating gates is equal to or wider than that of said first trenched gates.

12. The MOSFET of claim 1, further comprising at least a fourth trenched gate filled with said doped poly padded with said gate oxide disposed near an area of edge contacts to block source dopant lateral diffusion from said edge contacts for improving avalanche capability, said fourth trenched gate is shorted with said source regions and body regions through said source metal.

13. The MOSFET of claim 1, wherein said plurality of trenched source-body contacts in said active area has a uniform trenched contact width.

14. The MOSFET of claim 9, wherein among said trenched source-body contacts, at least one column or raw cells of closed cell near edge trench of said active area have greater trenched contact width than the others.

15. The MOSFET of claim 10, wherein among said trenched source-body contacts in said active area have larger trenched contact width near edge trench of said active area.

16. The MOSFET of claim 1, further comprises a plurality of edge contacts near edge trench of said active area penetrating through said second insulation layer and said source regions, and extending into said body region.

17. The MOSFET of claim 1, wherein there is no edge contacts near edge trench of said active area, and said body region between said edge trench and said second trenched gate has floating voltage.

18. The MOSFET of claim 1, wherein said second insulation layer is composed of a layer of un-doped SRO and a layer of BPSG or PSG.

19. The MOSFET of claim 18, wherein each of said trenched source-body contacts has a wider trench width in said BPSG or PSG layer than in said un-doped SRO layer.

* * * * *